United States Patent [19]

Nakamura et al.

[11] Patent Number: 6,132,929

[45] Date of Patent: Oct. 17, 2000

US006132929A

[54] POSITIVE TYPE PHOTOSENSITIVE COMPOSITION FOR INFRARED LASERS

[75] Inventors: Ippei Nakamura; Takeshi Kimura, both of Shizuoka-ken, Japan

[73] Assignee: Fuji Photo Film Co., Ltd., Minami-Ashigara, Japan

[21] Appl. No.: 09/167,659

[22] Filed: Oct. 7, 1998

[30] Foreign Application Priority Data

| | | | |
|---|---|---|---|
| Oct. 8, 1997 | [JP] | Japan | 9-275712 |
| Feb. 16, 1998 | [JP] | Japan | 10-032608 |
| Mar. 27, 1998 | [JP] | Japan | 10-081106 |
| Mar. 30, 1998 | [JP] | Japan | 10-084700 |

[51] Int. Cl.[7] .......... G03F 7/004

[52] U.S. Cl. .......... 430/270.1; 430/926

[58] Field of Search .......... 430/270.1, 926

[56] References Cited

U.S. PATENT DOCUMENTS

| | | | |
|---|---|---|---|
| 5,506,085 | 4/1996 | Van Damme et al. | 430/200 |
| 5,840,467 | 11/1998 | Kitatani et al. | 430/302 |
| 5,932,392 | 8/1999 | Hirai et al. | 430/270.1 |

FOREIGN PATENT DOCUMENTS

| | | |
|---|---|---|
| 330239 | 8/1989 | European Pat. Off. . |
| 64-31693 | 2/1989 | Japan . |
| 4-349462 | 12/1992 | Japan . |

OTHER PUBLICATIONS

Database WPI, Section Ch, Week 9601, Derwent Publications Ltd.

*Primary Examiner*—Cynthia Hamilton
*Assistant Examiner*—Rosemary Ashton
*Attorney, Agent, or Firm*—Burns, Doane, Swecker & Mathis, LLP

[57] ABSTRACT

An object of the present invention is to provide a positive type photosensitive composition for infrared lasers which is used with regard to a directly producible printing plate in which handling places are not restricted and in which developing latitude is excellent. This positive type photosensitive composition for infrared lasers comprises at least one aqueous alkaline solution-soluble polymer compound having at least one of the following functional groups (a-1) to (a-3):

(a-1) a phenolic hydroxyl group, (a-2) a sulfonamide group and (a-3) an active imide group and a compound represented by the following general formula I-(1) or the like.

I-(1)

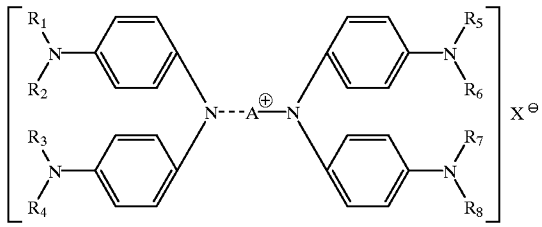

24 Claims, No Drawings

POSITIVE TYPE PHOTOSENSITIVE COMPOSITION FOR INFRARED LASERS

BACKGROUND OF THE INVENTION

1. Field of the Invention

The present invention relates to an image recording material which can be used as an offset printing master. More particularly, the present invention relates to a positive type photosensitive composition for infrared lasers which can be used with regard to a so-called directly producible printing plate, which can be directly produced based on digital signals output from a computer or the like.

2. Description of the Related Art

Conventionally, as systems for producing a printing plate directly from digital computer data, there have been proposed the following: (1) a system using an electrophotographic method; (2) a photopolymerization system using a combination of exposure with an Ar laser and post-heating; (3) a system in which a silver salt-sensitive material is laminated on a photosensitive resin; (4) a system using a silver master; and (5) a system which utilizes breaking down a silicone rubber layer with a laser or with electric discharge breakdown; as well as other methods.

However, the above method (1) using an electrophotographic method has complicated image formation processes such as charging, exposure, developing and the like, and thus, the apparatus for implementing this method becomes complicated and large. In the method (2), post-heating is required, and further, handling in an illuminated room is difficult since a highly sensitive printing plate is required. In the methods (3) and (4), since a silver salt is used, there are the disadvantages that processes become complicated and cost increases. Although the method (5) has a relatively high level of performance, the problem of removing silicone remaining on a plate surface remains.

On the other hand, laser technologies have developed remarkably in recent years. In particular, solid-state and semiconductor lasers that generate rays in a range from near-infrared to infrared and are high output and compact are readily available. These lasers are very useful as an exposing light source for recording in direct production of a printing plate from digital data such as digital computer data.

A positive type photosensitive composition for infrared lasers which is used as a material for directly producible printing plates is disclosed in Japanese Patent Application Laid-Open (JP-A) No.7-285275. The invention described in this publication relates to an image recording material obtained by adding to an aqueous alkaline solution-soluble resin a substance which absorbs light and generates heat and a positive type photosensitive compound such as quinonediazide compounds and the like. The positive type photosensitive compound works in image portions as a solubility inhibitor which substantially reduces the solubility of the aqueous alkaline solution-soluble resin. In non-image portions, the positive type photosensitive compound, due to being decomposed by heat, does not exhibit a solubility inhibiting ability and can be removed with developing. Consequently, an image is formed.

Such an image recording material has a disadvantage in that a positive type photosensitive compound such as a quinonediazide compound and the like reacts under white light since this compound has a light absorption range in a visible range (350 to 500 nm); therefore handling places are restricted to places illuminated by yellow light.

As a result of the investigations of the present inventors, it has been found that a positive type image can be obtained even if quinonediazide compounds are not added to an image recording material; however, an image recording material which simply excludes quinonediazide compounds exhibits a problem in that stability of sensitivity with regard to the concentration of a developing solution, namely, developing latitude, deteriorates.

SUMMARY OF THE INVENTION

Accordingly, an object of the present invention is to provide a positive type photosensitive composition for infrared lasers for use with regard to directly producible printing plates in which handling places thereof are not restricted and stability of sensitivity with regard to the concentration of a developing solution, namely, developing latitude, is excellent.

The present inventors have found that by using a specific dye and aqueous alkaline solution-soluble polymer compound, the resulting composition is not photosensitive even under white light, and developing latitude improves.

Namely, as that first aspect, the present invention provides a positive type photosensitive composition for infrared lasers comprising at least one aqueous alkaline solution-soluble polymer compound having at least one of the following functional groups (a-1) to (a-3):

(a-1) a phenolic hydroxyl group, (a-2) a sulfonamide group and (a-3) an active imide group and a compound represented by either of the following general formulae I-(1) and I-(2):

I-(1)

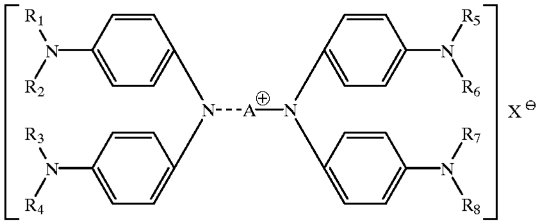

I-(2)

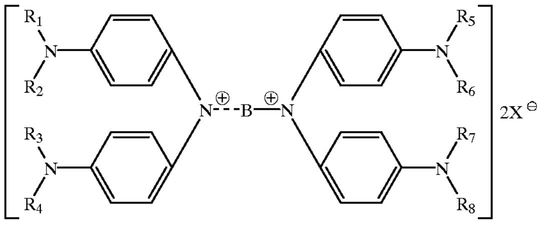

wherein, A represents

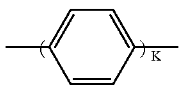

(wherein, k represents 1 or 2); B represents

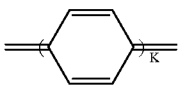

(wherein, k represents 1 or 2); and an aromatic ring may be substituted with a lower alkyl group, lower alkoxy group, halogen atom or hydroxyl group; $R_1$ to $R_8$ each independently represents a hydrogen atom, halogen atom, substituted or unsubstituted alkyl group, substituted or unsubstituted alkenyl group, substituted or unsubstituted aralkyl group, or substituted or unsubstituted alkynyl group; and $R_1$ and $R_2$, $R_3$ and $R_4$, $R_5$ and $R_6$, or $R_7$ and $R_8$, may form together with N a substituted or unsubstituted five-membered ring, substituted or unsubstituted six-membered ring, or substituted or unsubstituted seven-membered ring; and $X^-$ represents an anion, preferably a non-nucleophilic anion.

According to the first aspect of the present invention, because of interaction between the aqueous alkaline solution-soluble polymer and the compound represented by either of the above-described general formulae I-(1) and I-(2), the solubility of the aqueous alkaline solution-soluble polymer can be significantly reduced in image portions. In non-image portions, since the aqueous alkaline solution-soluble polymer recovers alkaline solution-solubility due to the decomposition of this compound represented by either of the above-described general formulae I-(1) and I-(2) and/or due to this compound being released from interaction with the aqueous alkaline solution-soluble resin, excellent discrimination in image formation is exhibited, and it becomes possible to form an excellent image having wide developing latitude. As a result, since addition of a compound having a light absorption range in a visible range (350 to 500 nm) such as a quinonediazide compound or the like is not essential, the composition can be used even under white light, and disadvantages wherein handling place are restricted to places illuminated by under yellow light are not present.

In the second aspect, the present invention provides a positive type photosensitive composition for infrared lasers comprising at least one aqueous alkaline solution-soluble polymer compound having at least one of the following functional groups (a-1) to (a-3):

(a-1) a phenolic hydroxyl group, (a-2) a sulfonamide group and (a-3) an active imide group and a compound represented by either of the following general formulae II-[1] and II-[2]:

II-[1]

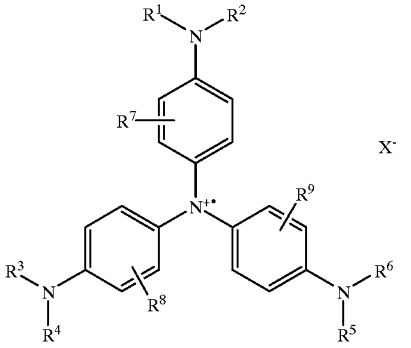

II-[2]

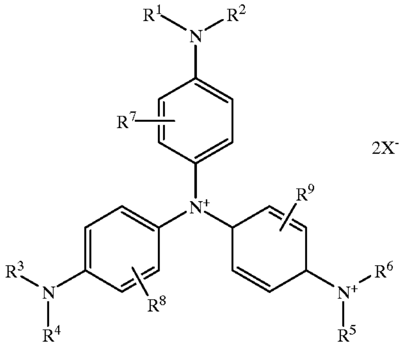

wherein, $R_1$ to $R_6$ each independently represents a hydrogen atom, substituted or unsubstituted alkyl group, substituted or unsubstituted alkenyl group, substituted or unsubstituted alkynyl group, substituted or unsubstituted cycloalkyl group, substituted or unsubstituted aryl group, substituted or unsubstituted aralkyl group or substituted or unsubstituted heterocyclic group; $R_1$ and $R_2$, $R_3$ and $R_4$, or $R_5$ and $R_6$, may form together with N a substituted or unsubstituted five-, six- or seven-membered ring; $R_7$ to $R_9$ each independently represents a hydrogen atom, halogen atom, substituted or unsubstituted alkyl group, substituted or unsubstituted alkoxy group, or a substituted or unsubstituted aryloxy group, cyano group or hydroxy group; and $X^-$ represents a monovalent anion.

According to the second aspect of the present invention, because of the interaction between the aqueous alkaline solution-soluble polymer compound and the compound represented by either of the above-described general formulae II-[1] and II-[2], the solubility of the aqueous alkaline solution-soluble polymer compound can be significantly reduced in image portions. In non-image portions, since the aqueous alkaline solution-soluble polymer compound recovers alkaline solution-solubility due to the decomposition of the compound represented by either of the above-described general formulae II-[1] and II-[2] and/or due to this compound being released from interaction with the aqueous alkaline solution-soluble polymer compound, excellent discrimination in image formation is exhibited, and it becomes possible to form an excellent image having wide developing latitude. As a result, since addition of a compound having a light absorption range in a visible range (350 to 500 nm) such as a quinonediazide compound or the like is not essential, the composition can be used even under white light, and there disadvantages wherein handling places are restricted to places under yellow light are not present.

DESCRIPTION OF THE PREFERRED EMBODIMENTS

The present invention will be described in detail below.

Aqueous Alkaline Solution-soluble Polymer Compound

The aqueous alkaline solution-soluble polymer compound used in the present invention is a polymer compound having in a molecule at least one functional group from among (a-1) a phenolic hydroxyl group, (a-2) a sulfonamide group or (a-3) an active imide group; Examples thereof include, but are not limited to, the following compounds.

Examples of polymer compounds having (a-1) a phenolic hydroxyl group include pyrogallol-acetone resins and novolak resins such as a phenol-formaldehyde resin, m-cresol-formaldehyde resin, p-cresol-formaldehyde resin, m-p-mixed-cresol-formaldehyde resin, phenol/cresol (may be m-, p-, or m-/p-mixed type) mixed formaldehyde resin, and the like.

In addition to the above-described compounds, a polymer compound having a phenolic hydroxyl group in a side chain can also be used as the polymer compound having a phenolic hydroxyl group. As the polymer compound having a phenolic hydroxyl group in a side chain, a polymer compound obtained by homopolymerization of a polymerizable monomer composed of a compound with a low molecular weight having one or more polymerizable unsaturated bonds and one or more phenolic hydroxyl groups, or obtained by copolymerization of the above-described monomer with other polymerizable monomer(s), can be listed as an example. Examples of the polymerizable monomer having a phenolic hydroxyl group include acrylamide, methacrylamide, acrylate, methacrylate, hydroxystyrene and the like. Specific examples thereof which can be suitably used include N-(2-hydroxyphenyl)acrylamide, N-(3-hydroxyphenyl)acrylamide, N-(4-hydroxyphenyl) acrylamide, N-(2-hydroxyphenyl)methacrylamide, N-(3-hydroxyphenyl)methacrylamide, N-(4-hydroxyphenyl) methacrylamide, o-hydroxyphenyl acrylate, m-hydroxyphenyl acrylate, p- hydroxyphenyl acrylate, m-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, 2-(4-hydroxyphenyl)ethyl methacrylate, and the like.

These resins having a phenolic hydroxyl group may be used alone or in combinations of two or more.

As is described in U.S. Pat. No. 4,123,279, polycondensates of formaldehyde and phenol, which have as a substituent an alkyl group having 3 to 8 carbon atoms, such as a t-butylphenol-formaldehyde resin and octylphenol-formaldehyde resin, may be used in addition.

As the aqueous alkaline solution-soluble polymer compound having (a-2) a sulfonamide group these can be listed as examples a polymer compound obtained by homopolymerization of a polymerizable monomer having a sulfonamide group or obtained by copolymerization of the above-described monomer with other polymerizable monomer(s). As the polymerizable monomer having a sulfonamide group, it is possible to list as an example a polymerizable monomer composed of a compound with a low molecular weight having at least one sulfonamide group —NH—$SO_2$— wherein a molecule of the sulfonamide group has one or more hydrogen atoms connected to a nitrogen atom and one or more polymerizable unsaturated bonds. Among these, a compound with a low molecular weight having an acryloyl group, an allyl group, or a vinyloxy group, in addition to either a substituted sulfonylimino group or a substituted or mono-substituted aminosulfonyl group, is preferable.

Examples of such compounds include compounds represented by the following general formulae.

(3)

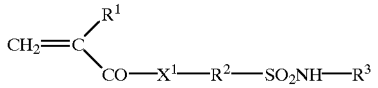

(4)

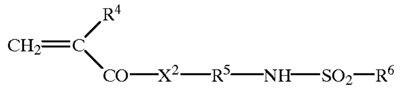

(5)

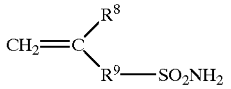

(6)

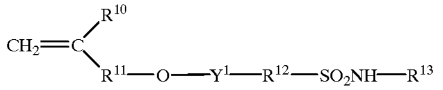

(7)

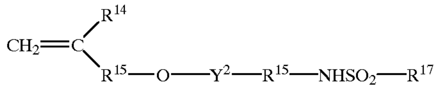

In the formulae, $X^1$ and $X^2$ each independently represents —O— or —$NR^7$—. $R^1$ and $R^4$each independently represents a hydrogen atom or —$CH_3$. $R^2$, $R^5$, $R^9$, $R^{12}$ and $R^{16}$ each independently represents an alkylene group, cycloalkylene group, arylene group or aralkylene group, wherein each group has 1 to 12 carbon atoms and may have a substituent. $R^3$, $R^7$ and $R^{13}$ each independently represents a hydrogen atom, or an alkyl group, cycloalkylene group, aryl group or aralkyl group, wherein each group has 1 to 12 carbon atoms and may have a substituent. $R^6$ and $R^{17}$ each independently represents an alkyl group, cycloalkylene group, aryl group or aralkyl group, wherein each group has 1 to 12 carbon atoms and may have a substituent. $R^8$, $R^{10}$ and $R^{14}$ each independently represents a hydrogen atom or —$CH_3$. $R^{11}$ and $R^{15}$ each independently represents a single bond or an alkyl group, cycloalkylene group, arylene group or aralkylene group, wherein each group has 1 to 12 carbon atoms and may have a substituent. $Y^1$ and $Y^2$ each independently represents a single bond or —CO—.

Specifically, m-aminosulfonylphenyl methacrylate, N-(p-aminosulfonylphenyl)methacrylamide, N-(p-aminosulfonylphenyl)acrylamide or the like can be suitably used.

The aqueous alkaline solution-soluble polymer compound having (a-3) an active imide group is a compound having in a molecule thereof an active imide group represented by the following formula. As this polymer compound, a polymer compound obtained by homopolymerization of a polymerizable monomer composed of a compound with a low molecular weight having in a molecule thereof at least one active imino group represented by the following formula and at least one polymerizable unsaturated bond, or obtained by copolymerization of the above-described monomer with other polymerizable monomer, can be listed as an example.

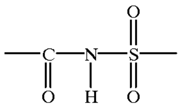

Specifically, as such a compound, N-(p-toluenesulfonyl) methacrylamide, N-(p-toluenesulfonyl)acrylamide and the like can be suitably used.

Further, as the aqueous alkaline solution-soluble polymer compound of the present invention, there can be used a polymer compound obtained by polymerization of two or more of the following polymerizable monomers: the above-described polymerizable monomer having a phenolic hydroxyl group, a polymerizable monomer having a sulfonamide group, and a polymerizable monomer having an active imide group. Alternatively, a polymer compound obtained by copolymerization of two or more of these polymerizable monomers with another polymerizable monomer can also be used as the aqueous alkaline solution-soluble polymer compound.

When the polymerizable monomer having a phenolic hydroxyl group is copolymerized with the polymerizable monomer having a sulfonamide group and/or the polymerizable monomer having an active imide group, the compounding ratio by weight of these components is preferably in the range from 50:50 to 5:95, and more preferably in the range from 40:60 to 10:90.

In the present invention, when the aqueous alkaline solution-soluble polymer compound is a copolymer of the above-described polymerizable monomer having a phenolic hydroxyl group, a polymerizable monomer having a sulfonamide group and a polymerizable monomer having an active imide group with another polymerizable monomer, a monomer imparting aqueous alkaline solution-solubility is preferably contained in an amount of 10 mol % or more, and more preferably in an amount of 20 mol % or more. When the amount of the copolymer component is less than 10 mol %, aqueous alkaline solution-solubility tends to be insufficient, and an effect of improving developing latitude is not always sufficiently attained.

Examples of the other copolymerization monomer component which is copolymerized with the above-described polymerizable monomer having a phenolic hydroxyl group, with a polymerizable monomer having a sulfonamide group and with a polymerizable monomer having an active imide group include, but are not limited to, monomers listed in the following M-1 to M-12.

M-1: Acrylates and methacrylates having an aliphatic hydroxyl group such as 2-hydroxyethyl acrylate, 2-hydroxyethyl methacrylate and the like.

M-2: Alkyl acrylates such as methyl acrylate, ethyl acrylate, propyl acrylate, butyl acrylate, amyl acrylate, hexyl acrylate, octyl actylate, benzyl acrylate, 2-chloroethyl acrylate, glycidyl acrylate, N-dimethylaminoethyl acrylate and the like.

M-3: Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylaminoethyl methacrylate and the like.

M-4: Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide and the like.

M-5: Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like.

M-6: Vinyl esters such as vinyl acetate, vinyl chloro acetate, vinyl butylate, vinyl benzoate and the like.

M-7: Styrenes such as styrene, α-methylstyrene, methylstyrene, chloromethylstyrene and the like.

M-8: Vinyl ketones such as methyl vinyl ketone, ethyl vinyl ketone, propyl vinyl ketone, phenyl vinyl ketone and the like.

M-9: Olefins such as ethylene, propylene, isobutylene, butadiene, isoprene and the like.

M-10: N-vinylpyrrolidone, N-vinylcarbazole, 4-vinylpyridine, acrylonitrile, methacrylonitrile and the like.

M-11: Unsaturated imides such as maleimide, N-acrylonitrile, N-acetylmethacrylamide, N-propionylmethacrylamide, N-(p-chlorobenzoyl) methacrylamide and the like.

M-12: Unsaturated carboxylic acid such as acrylic acid, methacrylic acid, maleic anhydride, itaconic acid and the like.

In the present invention, when the aqueous alkaline solution-soluble polymer compound is a homopolymer or copolymer all of the above-described polymerizable monomer having a phenolic hydroxyl group, polymerizable monomer having a sulfonamide group or polymerizable monomer having an active imide group, a compound having a weight-average molecular weight of 2000 or more and a number-average molecular weight of 500 or more is preferable. A compound having a weight-average molecular weight of 5,000 to 300,000, a number-average molecular weight of 800 to 250,000 and a degree of dispersion (weight-average molecular weight/number-average molecular weight) of 1.1 to 10 is more preferable.

In the present invention, when the aqueous alkaline solution-soluble polymer compound is a resin such as a phenol-formaldehyde resin, a cresol-aldehyde resin and the like, a compound having a weight-average molecular weight of 500 to 20,000 and a number-average molecular weight of 200 to 10,000 is preferable.

These aqueous alkaline solution-soluble polymer compounds may be used alone or in combinations of two or more, and are used in an amount from 30 to 99% by weight, preferably from 40 to 95% by weight, and particularly preferably from 50 to 90% by weight based on the total weight of solid components of a printing plate material. When the amount added of the aqueous alkaline solution-soluble polymer compound is less than 30% by weight, durability of a recording layer deteriorates, and when over 99% by weight, sensitivity and durability are both poor.

Compound represented by either of general formulae I-(1) and I-(2)

In the present invention, any one of the dyes (compounds) represented by either of the following general formulae I-(1) and I-(2) is used.

I-(1)

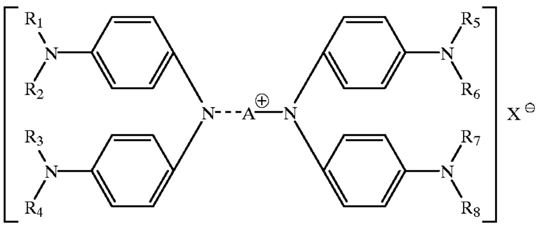

I-(2)

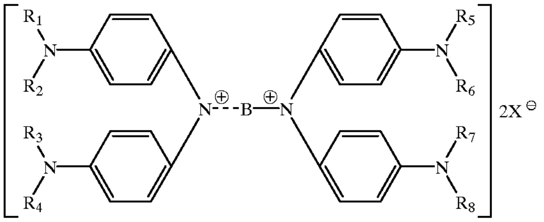

In the above formulae, A represents

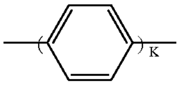

(wherein, k represents 1 or 2), and B represents

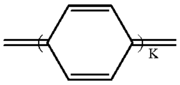

(wherein, k represents 1 or 2); an aromatic ring may be substituted by a lower alkyl group, lower alkoxy group, halogen atom or hydroxyl group. $R_1$ to $R_8$ each independently represents a hydrogen atom, halogen atom, substituted or unsubstituted alkyl group, substituted or unsubstituted alkenyl group, substituted or unsubstituted aralkyl group, or substituted or unsubstituted alkynyl group, and $R_1$ and $R_2$, $R_3$ and $R_4$, $R_5$ and $R_6$, or $R_7$ and $R_8$, may each form together with N a substituted or unsubstituted five-membered ring, substituted or unsubstituted six-membered ring, or substituted or unsubstituted seven-membered ring. $X^-$ represents an anion.

The compounds represented by either of the above-described general formulae I-(1) and I-(2) are known compounds; it is known from descriptions in U.S. Pat. Nos. 3,575,871, 3,557,012 and the like that the maximum absorption strength thereof is 900 nm or more, that the molar absorptivity thereof has a high absorption peak at the level of several ten thousands to several hundred thousands, and that the compound can be used for a heat insulation film or a material for laser recording on an optical disk, or for sunglasses and the like.

Any one of the compounds represented by either of the above-described general formula I-(1) or I-(2) can significantly reduced the solubility of the aqueous alkaline solution-soluble resin in image portions by interacting with the aqueous alkaline solution-soluble resin. Excellent discrimination in image formation is exhibited, since in non-image portions the aqueous alkaline solution-soluble resin recovers alkaline solution-solubility, due to generation of a cation with the decomposition of this compound represented by either of the above-described general formulae I-(1) or I-(2), and/or due to this compound being released from interaction with the aqueous alkaline solution-soluble resin because of heat generated by absorption of near-infrared rays.

The compounds represented by either of the above-described general formulae I-(1) and I-(2) will be explained in further detail below.

In the above-described general formulae I-(1) and I-(2), $R_1$ to $R_8$ each independently represents a hydrogen atom, halogen atom, substituted or unsubstituted alkyl group, substituted or unsubstituted alkenyl group, substituted or unsubstituted aralkyl group, or substituted or unsubstituted alkynyl group. $R_1$ and $R_2$, $R_3$ and $R_4$, $R_5$ and $R_6$, or $R_7$ and $R_8$ may each form together with N a substituted or unsubstituted five-membered ring, substituted or unsubstituted six-membered ring, or substituted or unsubstituted seven-membered ring.

Examples of the halogen atom which may be represented by $R_1$ to $R_8$ include fluorine, chlorine, bromine, iodine and the like. Examples of the alkyl group include a methyl group, ethyl group, n-propyl group, iso-propyl group, n-butyl group, sec-butyl group, iso-butyl group, t-butyl group, n-amyl group, t-amyl group, n-hexyl group, n-octyl group, t-octyl group and the like, as well as other substituted alkyl groups, for example, a 2-hydroxyethyl group, 3-hydroxypropyl group, 4-hydroxybutyl group, 2-acetoxyethyl group, 2-carboxymethyl group, 3-carboxypropyl group, methoxyethyl group, ethoxyethyl group, methoxypropyl group, 2-chloroethyl group and the like.

Examples of the alkenyl group include a vinyl group, propenyl group, butenyl group, pentenyl group, hexenyl group, heptenyl group, octenyl group and the like. Examples of the aralkyl group include a benzyl group, p-chlorobenzyl group, p-methylbenzyl group, 2-phenylmethyl group, 2-phenylpropyl group, 3-phenylpropyl group, α-naphthylmethyl group, β-naphthylethyl group and the like. Examples of the alkynyl group include a propargyl group, butynyl group, pentynyl group, hexynyl group and the like.

As the substituted or unsubstituted five-membered ring which can be formed with N together with $R_1$ and $R_2$, $R_3$ and $R_4$, $R_5$ and $R_6$, or $R_7$ and $R_8$, a pyrrolidine ring and the like are listed as examples. As the substituted or unsubstituted six-membered ring, a piperidine ring, morpholine ring, tetrahydropyridine ring and the like are listed as examples. As the substituted or unsubstituted seven-membered ring, a cyclohexylamine ring and the like are listed as examples.

In the above-described general formulae I-(1) and I-(2), $X^-$ represents an anion. For example, anions represented by the formula $MQ_n^-$ (M is an atom selected from among B, P, As, Sb, Fe, Al, Sn, Zn, Ti, Cd, Mo, W and Zr, and preferably from among B, P, As or Sb. Q represents a halogen atom, and n is an integer from 1 to 6) or the formula $MQ_{n-1}(OH)^-$ (wherein, M, Q and n are defined as above) may be listed as examples thereof. As preferable anions among the anions represented by the formula $MQ_n^-$, $BF_4^-$, $PF_6^-$, $AsF_6^-$, $SbF_6^-$ and the like are listed as examples. Among these, $SbF_6$– is particularly preferable. As preferable anions among the anions represented by the formula $MQ_{n-1}(OH)^-$, $SbF_5(OH)^-$ and the like are listed as examples.

Further examples of other anions include the following compounds:

An-1) Perchlorate ion,

An-2) Trifluoromethyl sulfite ion,

An-3) Methanesulfonate ion,

An-4) Ethanesulfonate ion,
An-5) 1-Propanesulfonate ion,
An-6) 2-Propanesulfonate ion,
An-7) n-Butanesulfonate ion,
An-8) Allylsulfonate ion,
An-9) 10-Camphorsulfonate ion,
An-10) Trifluoromethanesulfonate ion,
An-11) Pentafluoroethanesulfonate ion,
An-12) Benzenesulfonate ion,
An-13) p-Toluenesulfonate ion,
An-14) 3-Methoxybenzenesulfonate ion,
An-15) 4-Methoxybenzenesulfonate ion,
An-16) 4-Hydroxybenzenesulfonate ion,
An-17) 4-Chlorobenzenesulfonate ion,
An-18) 3-Nitrobenzenesulfonate ion,
An-19) 4-Nitrobenzenesulfonate ion,
An-20) 4-Acetylbenzenesulfonate ion,
An-21) Pentafluorobenzenesulfonate ion,
An-22) 4-Dodecylbenzenesulfonate ion,
An-23) Mesitylenesulfonate ion,
An-24) 2,4,6-Triisopropylbenzenesulfonate ion,
An-25) 2-hydroxy-4-methoxybenzophenone-5-sulfonate ion,
An-26) Isophthalic acid dimethyl-5-sulfonate ion,
An-27) Diphenylamine-4-sulfonate ion,
An-28) 1-Naphthalenesulfonate ion,
An-29) 2-Naphthalenesulfonate ion,
An-30) 2-Naphthol-6-sulfonate ion,
An-31) 2-Naphthol-7-sulfonate ion,
An-32) Anthraquinone-1-sulfonate ion,
An-33) Anthraquinone-2-sulfonate ion,
An-34) 9,10-Dimethoxyanthracene-2-sulfonate ion,
An-35) 9,10-Diethoxyanthracene-2-sulfonate ion,
An-36) Quinoline-8-sulfonate ion,
An-37) 8-Hydroxyquinoline-5-sulfonate ion,
An-38) 8-Anilio-naphthalene-1-sulfonate ion, and the like.

For producing the compounds represented by either of the general formulae I-(1) and I-(2) in the present invention, methods described in U.S. Pat. Nos. 3,251,881, 3,484,467, 3,575,871 and JP-A No. 61-69,991 can be utilized, for example. These compounds can be produced for example by the following procedure.

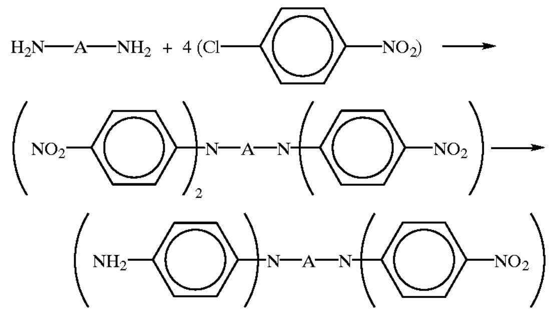

An amino compound obtained by the above-described Ullmann reaction and reduction can be selectively alkylated, and thereafter oxidized to obtain an intended compound.

Specific examples of the compounds represented by either of the general formulae I-(1) and I-(2) are listed below.

First, examples of the compounds represented by the general formula I-(1) are listed. For the purpose of simplification, compounds of the general formula I-(1) are described by listing portions in the general formula I-(1) in the order of A, X, $(R_1R_2)$, $(R_3R_4)$, $(R_5R_6)$, and $(R_7R_8)$. For example, when A is k=1, $X^-$ is $SbF_6^-$, and $R_1$ to $R_8$ each represent an isopropyl group, the compound is represented as shown below.

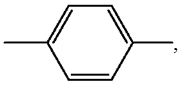 , $AsF_6$, (iso-$C_3H_7$ iso-$C_3H_7$)$_4$

In addition to the above-described example, the following compounds are listed as examples.

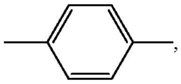 , $SbF_6$, (n-$C_4H_9$ n-$C_4H_9$)$_4$

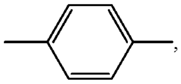 , $SbF_6$, ($CH_2CH{=}CH_2$ $CH_2CH{=}CH_2$)$_4$

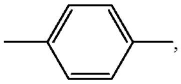 , $SbF_6$, ($CH_2C_6H_5$ $CH_2C_6H_5$)$_4$

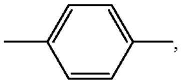 , $SbF_6$, ($CH_2CH_2CH_2OH$ $CH_2CH_2CH_2OH$)$_4$

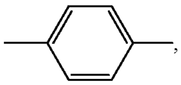 , $SbF_6$, ($CH_2CH_2OCH_3$ $CH_2CH_2OCH_3$)$_4$

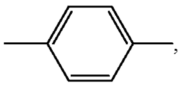 , $SbF_6$, (iso-$C_3H_7$ iso-$C_3H_7$)$_2$($C_2H_5$ $C_2H_5$)$_2$

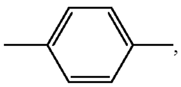 , $AsF_6$, ($CH_2CH{=}CH_2$ $CH_2CH{=}CH_2$)$_4$

-continued

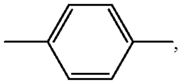 , $AsF_6$, $(CH_2C_6H_5\ CH_2C_6H_5)_4$

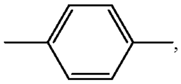 , $AsF_6$, $(CH_2CH_2CH_2OH\ CH_2CH_2CH_2OH)_4$

 , $PF_6$, $(CH_2CH_2OCH_3\ CH_2CH_2OCH_3)_4$

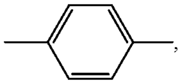 , $PF_6$, $(iso\text{-}C_4H_9\ iso\text{-}C_4H_9)_2(C_2H_5\ C_2H_5)_2$

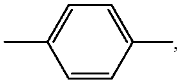 , $PF_6$, $(n\text{-}C_6H_{13}\ n\text{-}C_6H_{13})_4$

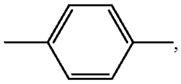 , $PF_6$, $(CH_2CH_2CH{=}CH_2\ CH_2CH_2CH{=}CH_2)_4$

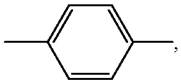 , $BF_4$, $(n\text{-}C_9H_{19}\ n\text{-}C_9H_{19})_4$

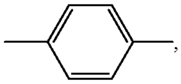 , $BF_4$, $(CH_2CH_2OH\ CH_2CH_2OH)_4$

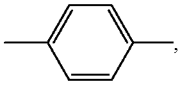 , $BF_4$, $(CH_2CH_2OCH_3\ CH_2CH_2OCH_3)_4$

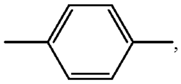 , $BF_4$, $(iso\text{-}C_3H_7\ iso\text{-}C_3H_7)_3(CH_3\ CH_3)$

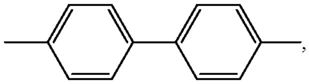 , $SbF_6$, $(n\text{-}C_4H_9\ n\text{-}C_4H_9)_4$

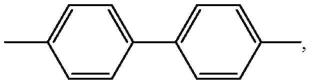 , $SbF_6$, $(CH_2CH{=}CH_2\ CH_2CH{=}CH_2)_4$

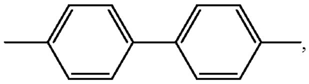 , $SbF_6$, $(CH_2CH_2OC_2H_5\ CH_2CH_2OC_2H_5)_4$

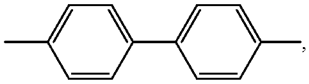 , $SbF_6$, $(iso\text{-}C_3H_7\ iso\text{-}C_3H_7)_4$

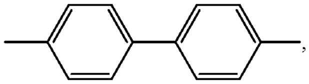 , $AsF_6$, $(CH_2CH_2OH\ CH_2CH_2OH)_4$

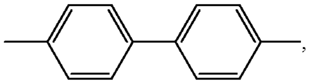 , $AsF_6$, $(CH_3\ CH_3)_2(C_2H_5\ C_2H_5)_2$

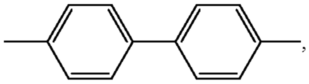 , $AsF_6$, $(n\text{-}C_{12}H_{25}\ n\text{-}C_{12}H_{25})_4$

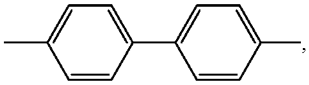 , $PF_6$, $(CH_2CH{=}CH_2\ CH_2CH{=}CH_2)_2(H\ H)_2$

-continued

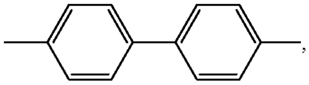, $PF_6$, $(CH_2CH_2OCH_3\ CH_2CH_2OCH_3)_4$

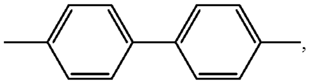, $PF_6$, (iso-$C_3H_7$ iso-$C_3H_7$)$_4$

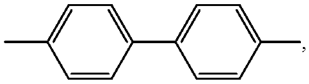, $BF_4$, $(CH_2CH_2CH_2OH\ CH_2CH_2CH_2OH)_4$

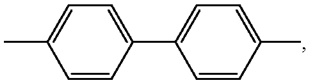, $BF_4$, $(CH_3\ CH_3)_4$

Next, examples of the compounds represented by the general formula I-(2) are listed. For the purpose of simplification, compounds of the general formula I-(2) are described by, listing portions in the general formula I-(2) in the order of B, X, $(R_1R_2)$, $(R_3R_4)$, $(R_5R_6)$, and $(R_7R_8)$. For example, when B is k=1, $X^-$ is $SbF_6^-$, $R_1$ and $R_2$ are each an ethyl group, and $R_3$ to $R_8$ each represent an n-butyl group, the compound is represented as shown below.

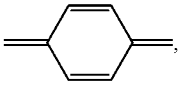, $SbF_6$, $(C_2H_5\ C_2H_5)$(n-$C_4H_9$ n-$C_4H_9$)$_3$

In addition to the above-described example, the following compounds are listed.

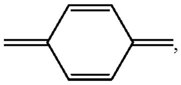, $SbF_6$, (n-$C_4H_9$ n-$C_4H_9$)$_4$

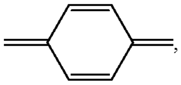, $SbF_6$, $(CH_2CH_2OH\ CH_2CH_2OH)_4$

, $SbF_6$, (p-$ClC_6H_5CH_2$ p-$ClC_6H_5CH_2$)$_4$

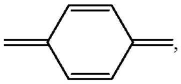, $SbF_6$, $(CH_2CH_2OCOCH_3\ CH_2CH_2OCOCH_3)_4$

, $SbF_6$, $(CH_2CH_2CH{=}CH_2\ CH_2CH_2CH{=}CH_2)_4$

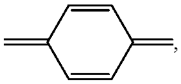, $SbF_6$, $(C_2H_4Cl\ C_2H_4Cl)_3(CH_3\ CH_3)$

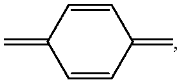, $AsF_6$, (n-$C_3H_7$ n-$C_3H_7$)$_4$

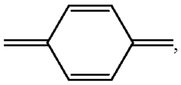, $AsF_6$, $(CH_2CH_2CH_2CH_2OH\ CH_2CH_2CH_2CH_2OH)_4$

, $AsF_6$, (p-$ClC_6H_5CH_2$ p-$ClC_6H_5CH_2$)$_4$

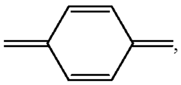, $AsF_6$, $(CH_2CH_2CH_2OCH_3\ CH_2CH_2CH_2OCH_3)_4$

-continued

, $PF_6$, $(CH_2CH_2CH{=}CH_2\ CH_2CH_2CH{=}CH_2)_4$

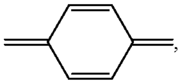, $PF_6$, $(C_2H_4Br\ C_2H_4Br)_2(CH_3\ CH_3)_2$

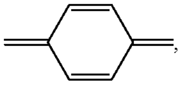, $PF_6$, $(n\text{-}C_4H_9\ n\text{-}C_4H_9)_4$

, $PF_6$, $(CH_2CH_2OH\ CH_2CH_2OH)_4$

, $BF_4$, $(p\text{-}CH_3C_6H_4CH_2\ p\text{-}CH_3C_6H_4CH_2)_4$

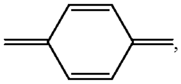, $BF_4$, $(CH_2CH_2OCOCH_3\ CH_2CH_2OCOCH_3)_4$

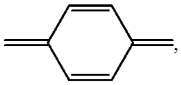, $BF_4$, $(CH_2CH_2\overset{CH_3}{\overset{|}{C}}{=}CH_2\ CH_2CH_2\overset{CH_3}{\overset{|}{C}}{=}CH_2)_4$

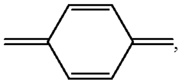, $BF_4$, $(C_2H_5\ C_2H_5)_2(H\ H)_2$

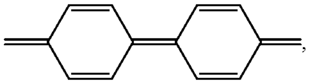, $SbF_6$, $(n\text{-}C_8H_{17}\ n\text{-}C_8H_{17})_4$

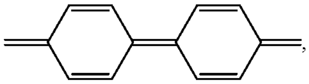, $SbF_6$, $(CH_2CH_2Cl\ CH_2CH_2Cl)_2(CH_3\ CH_3)_2$

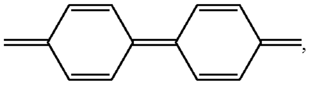, $SbF_6$, $(C_2H_5\ C_2H_5)_4$

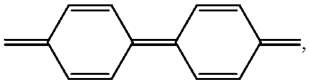, $SbF_6$, $(t\text{-}C_4H_9\ t\text{-}C_4H_9)_4$

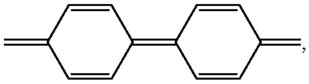, $AsF_6$, $(CH_2CH_2OH\ CH_2CH_2OH)_2(H\ H)_2$

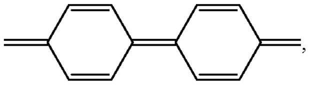, $AsF_6$, $(n\text{-}C_3H_7\ n\text{-}C_3H_7)_4$

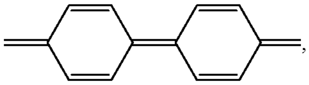, $PF_6$, $(n\text{-}C_5H_{11}\ n\text{-}C_5H_{11})_4$

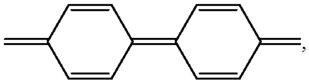, $PF_6$, $(CH_2CH{=}CHCl\ CH_2CH{=}CHCl)_4$

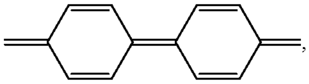, $PF_6$, $(sec\text{-}C_4H_9\ sec\text{-}C_4H_9)_4$

-continued

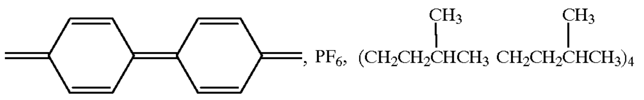

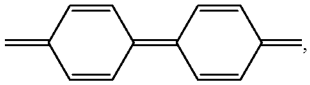, $BF_4$, $(CH_2CH_2Br\ CH_2CH_2Br)_4$

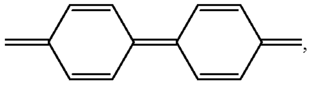, $BF_4$, $(CH_2CH_2CH_2CH_2OH\ CH_2CH_2CH_2CH_2OH)_4$

Compound Represented by Either of General Formulae II-[1] and II-[2]

In the present invention, any one of dyes (compounds) represented by either of the following general formulae II-[1] and II-[2] is used.

II-[1]

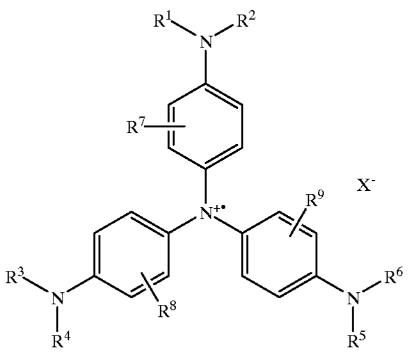

II-[2]

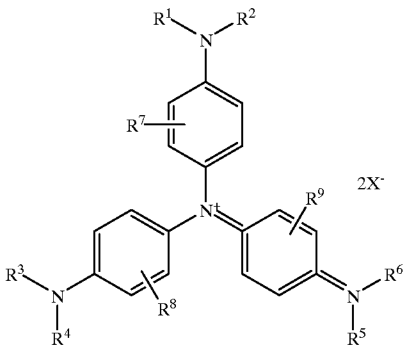

In these formulae, $R_1$ to $R_6$ each independently represents a hydrogen atom, substituted or unsubstituted alkyl group, substituted or unsubstituted alkenyl group, substituted or unsubstituted alkynyl group, substituted or unsubstituted cycloalkyl group, substituted or unsubstituted aryl group, substituted or unsubstituted aralkyl group or substituted or unsubstituted heterocyclic group, and $R_1$ and $R_2$, $R_3$ and $R_4$, $R_5$ and $R_6$, or $R_7$ and $R_8$, may each form together with N a substituted or unsubstituted five-, six- or seven-membered ring. $R_7$ to $R_9$ each independently represents a hydrogen atom, halogen atom, substituted or unsubstituted alkyl group, substituted or unsubstituted alkoxy group, substituted or unsubstituted aryloxy group, cyano group or hydroxyl group. $X^-$ represents a monovalent anion.

The compounds represented by either of the above-described general formulae II-[1] and II-[2] are known compounds; as described in JP-A Nos. 6-256754 and 7-133437, for example, it is known that the maximum absorption strength thereof is 800 nm or more, that the molar absorptivity thereof has a high absorption peak at the level of several ten thousands to several hundred thousands, and that the compounds can be used for a heat insulation film or a material for laser recording on an optical disk, or for sunglasses and the like, utilizing this high infrared ray absorption ability.

Any one of the compounds represented by either of the above-described general formulae II-[1] and II-[2] can significantly reduce the solubility of the aqueous alkaline solution-soluble polymer compound in image portions by interacting with the above-described aqueous alkaline solution-soluble polymer compound. Excellent discrimination in image formation is exhibited, since in non-image portions the aqueous alkaline solution-soluble polymer compound recovers alkali solution-solubility, due to generation of a cation by the decomposition of the compound itself represented by the above-described general formula II-[1] or II-[2], and/or due to this compound being released from interaction with the aqueous alkaline solution-soluble resin because of heat generated by absorption of near-infrared rays.

The compounds represented by either of the above-described general formulae II-[1] and II-[2] will be explained in further detail below.

In the above-described general formulae II-[1] and II-[2], $R_1$ to $R_6$ each independently represents a hydrogen atom, substituted or unsubstituted alkyl group, substituted or unsubstituted alkenyl group, substituted or unsubstituted alkynyl group, substituted or unsubstituted cycloalkyl group, substituted or unsubstituted aryl group, substituted or unsubstituted aralkyl group, or substituted or unsubstituted heterocyclic group, and $R_1$ and $R_2$, $R_3$ and $R_4$, or $R_5$ and $R_6$ may each form together with N a substituted or unsubstituted five-, six- or seven-membered ring. In this N-containing heterocycle, a hetero atom(s) such as oxygen, sulfur or the like may further be contained in addition to nitrogen.

As the substituted or unsubstituted alkyl group of $R_1$ to $R_6$, a linear or branched group having 1 to 15 carbon atoms is preferable. Examples thereof include a methyl group, ethyl group, n-propyl group, iso-propyl group, n-butyl group, sec-butyl group, iso-butyl group, t-butyl group, n-amyl group, t-amyl group, n-hexyl group, n-octyl group, t-octyl group and the like, as well as an n-decyl group, n-dodecyl group and the like. As the substituent for the alkyl group, a halogen atom, hydroxyl group, alkoxy group, alkoxycarbonyl group, cyano group, amino group, dialkylamino group and the like are listed as examples. Examples of the substituted alkyl group include a trifluoromethyl group, trifluoromethylethyl group, chloroethyl group, perfluoropropyl group, 2-chloroethyl group, 2-hydroxyethyl group, 3-hydroxypropyl group, 4-hydroxybutyl group, methoxymethyl group, methoxyethyl group, ethoxyethyl group, methoxypropyl group, propoxypropyl group, methoxycarbonylethyl group, cycnoethyl group, cyanopropyl group and the like.

As the substituted or unsubstituted alkenyl group, a linear or branched group having 2 to 15 carbon atoms is preferable. Examples thereof include a vinyl group, 2-propenyl group, 3-butenyl group, 4-pentenyl group, hexenyl group, heptenyl group, octenyl group and the like.

As the substituted or unsubstituted alkynyl group, a linear or branched group having 2 to 8 carbon atoms is preferable. Examples thereof include a propargyl group, butynyl group, pentynyl group, hexynyl group and the like.

As the substituted or unsubstituted cycloalkyl group, a group having 3 to 15 carbon atoms is preferable. Examples thereof include a cyclohexyl group, cyclopropyl group, cyclobutyl group, cyclopentyl group, cyclooctyl group, 2,3-dimethylcyclohexyl group and the like.

As the substituted or unsubstituted aryl group, a group having 6 to 20 carbon atoms is preferable. Examples thereof include a phenyl group, toluyl group, xylyl group, dimethylaminophenyl group, diethylaminophenyl group, methoxyphenyl group and the like.

As the substituted or unsubstituted aralkyl group, a group having 7 to 20 carbon atoms is preferable. Examples thereof include a benzyl group, p-chlorobenzyl group, p-methylbenzyl group, 2-phenylethyl group, 2-phenylpropyl group, 3-phenylpropyl group, α-naphthylmethyl group, β-naphthylethyl group and the like.

As the substituted or unsubstituted heterocyclic group, polycyclic hetero ring such as furan, thiophen, pyrrole, azole, pyran, thiopyran, pyridine, azines, prine and the like, thiazole, cyclic ether, lactone, cyclic imine, lactam and the like are listed as examples.

As a substituent of the alkenyl group, the alkynyl group, cycloalkyl group, the aryl group, the aralkyl group and the heterocyclic group, a substituent of the alkyl group is likewise used.

As the substituted or unsubstituted five-membered ring which can be formed with N together with $R_1$ and $R_2$, $R_3$ and $R_4$, or $R_5$ and $R_6$ a pyrrolidine ring, 3-pyrroline ring, pyrrolidinedione ring and the like are listed as examples. As the substituted or unsubstituted six-membered ring, a piperidine ring, morpholine ring, tetrahydropyridine ring and the like are listed as examples. As the substituted or unsubstituted seven-membered ring, a hexamethyleneimine ring (perhydroazepine ring) and the like are listed as examples.

In the above-described general formulae a II-[1] and II-[2], $X^-$ represents an anion. For example, $Br^-$, $Cl^-$, $I^-$, $NO_3^-$ and the like, in addition to anions represented by the formula $MQ_n^-$ (M is an atom selected from among B, P, As, Sb, Fe, Al, Sn, Zn, Ti, Cd, Mo, W and Zr, and preferably from among B, P, As or Sb. Q represents a halogen atom, and n is an integer from 1 to 6.) or the formula $MQ_{n-1}(OH)^-$ (wherein, M, Q and n are defined us above are listed as examples). As preferred anions among the anions represented by the formula $MQ_n^-$, $BF_4^-$, $PF_6^-$, $AsF_6^-$, $SbF_6^-$ and the like are listed as examples. Among these, $SbF_6^-$ is particularly preferable. As preferred anions among the anions represented by the formula $MQ_{n-1}(OH)^-$, $SbF_5(OH)^-$ and the like are listed as examples.

Further, examples of other anions include the above-described An-1) to An-38), and the like.

To produce the compounds represented by either of the general formulae II-[1] and II-[2] in the present invention, a method described in Chemische Berichte, vol. 92, p. 245 (1959) can be used, for example, and these compounds can be easily obtained by oxidation treatment of the corresponding triarylamine with silver perchlorate, hexafluoroantimony silver and the like. For example, the compounds can be produced by the following procedure.

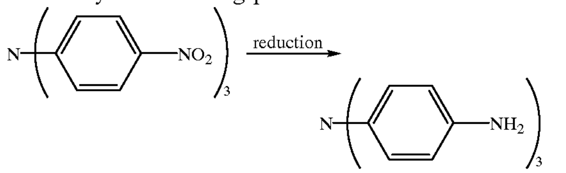

An amino compound obtained by the above-described reduction reaction can be substituted through alkylation, alkenylation, alkynylation, arylation, aralkylation, cyclation and the like to obtain the final compound. When $R_1$ to $R_6$ are not in symmetry, this alkylation has to be conducted in multiple steps. From the viewpoint of cost, it is preferable that $R_1$ to $R_6$ each represent the same group.

Specific examples of the compounds represented by either of the general formulae II-[1] and II-[2] include, but are not limited to, the following compounds. For the purpose of simplification, there are cases in which the compounds represented by either of the general formulae II-[1] and II-[2] are described in the order of X, $(R_1R_2)$, $(R_3R_4)$, $(R_5R_6)$, and $(R_7R_8R_9)$. For example, when $X^-$ is $ClO_4^-$, $R_1$ and $R_2$, $R_3$ and $R_4$, and $R_5$ and $R_6$ each form together with N a pyrrolidine ring (five-membered ring) and $R_7$ to $R_9$ are each a hydrogen atom, the compounds are represented as shown below.

X $(R_1R_2)$ $(R_3R_4)$ $(R_5R_6)$ $(R_7R_8R_9)$ $ClO_4$ $(CH_2CH_2CH_2CH_2)_3$ (H, H, H)

| Compound No. | X | $(R_1R_2)$ $(R_3R_4)$ $(R_5R_6)$ | $(R_7R_8R_9)$ |
|---|---|---|---|
| II-[1]-(1) | $SbF_6$ | $(CH_2CH_2CH_2CH_2CH_2)_3$ | (H,H,H) |
| II-[1]-(2) | $ClO_4$ | $(CH(CH_3)CH_2CH_{2CH2})_3$ | (H,H,H) |
| II-[1]-(3) | $AsF_6$ | $(CH_2CH_2OCH_2CH_2)_3$ | (H,H,H) |
| II-[1]-(4) | Br | $(CH{=}C(CH_3)CH_2C(CH_3)_2CH_2)_3$ | (H,H,H) |
| II-[1]-(5) | $SbF_6$ | $(CH(CH_3)CH_2CH_2CH(CH_3))_3$ | (H,H,H) |
| II-[1]-(6) | $NO_3$ | $(CH_2CH(OH)—CH(OH)CH_2)_3$ | (H,H,H) |
| II-[1]-(7) | Cl | $(CH_2—CO—CO—CH_2)_3$ | (H,H,H) |
| II-[1]-(8) | I | $(CH_2CH_2OCH_2CH_2)_3$ | (H,H,H) |
| II-[1]-(9) | $CH_3SO_3$ | $(CH_2CH{=}CHCH_2)_3$ | (H,H,H) |
| II-[1]-(10) | $CH_3SO_3$ | $(CH(CH_3)—CO—CO—CH(CH_3))_3$ | (H,H,H) |
| II-[1]-(11) | $BF_4$ | $(CH_2CH_2CH_2CH_2)_3$ | (H,H,H) |
| II-[1]-(12) | $AsF_6$ | $(CH_2CH_2CF_2CF_2)_3$ | (H,H,H) |
| II-[1]-(13) | Br | $(CH_2C{\equiv}CCH_2)_3$ | (H,H,H) |
| II-[1]-(14) | $SbF_6$ | $(C(CH_3)_2CH_2CH_2CH_2)_3$ | (H,H,H) |
| II-[1]-(15) | $ClO_4$ | $(CH_2CH_2SCH_2CH_2)_3$ | (H,H,H) |

-continued

| Compound No. | X | $(R_1R_2)$ $(R_3R_4)$ $(R_5R_6)$ | $(R_7R_8R_9)$ |
|---|---|---|---|
| II-[1]-(16) | $SbF_6$ | $(CH=C(CH_3)CH_2C(CH_3)_2CH_2)_3$ | (H,H,H) |
| II-[1]-(17) | $AsF_6$ | $(CH_2CH_2CH_2CH_2CH_2)_3$ | (H,H,H) |
| II-[1]-(18) | $ClO_4$ | $(CH_2-CO-CO-CH_2)_3$ | (H,H,H) |
| II-[1]-(19) | I | $(CH(CH_3)CH_2CH_2CH_2)_3$ | (H,H,H) |
| II-[1]-(20) | $NO_3$ | $(CH(CH_3)CH_2CH_2CH_2CH(CH_3))_3$ | (H,H,H) |
| II-[1]-(21) | $SbF_6$ | $(CH(Cl)CH_2CH_2CH_2)_3$ | (H,H,H) |
| II-[1]-(22) | $AsF_6$ | $(CH_2CH=CHCH_2)_3$ | (H,H,H) |
| II-[1]-(23) | $ClO_4$ | $(CH_2C\equiv CCH_2)_3$ | (H,H,H) |
| II-[1]-(24) | $BF_6$ | $(CH_2CH_2CH(OH)CH_2)_3$ | (H,H,H) |
| II-[1]-(25) | $SbF_6$ | $(CH_2CH(OH)CH(OH)CH_2)_3$ | (H,H,H) |
| II-[1]-(26) | 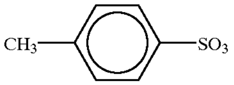 | $(CH_2CH_2CH_2CH_2)_3$ | (H,H,H) |
| II-[1]-(27) | Br | $(CH(CH_3)CH_2CH_2CH_2CH_2CH_2)_3$ | (Cl,Cl,Cl) |
| II-[1]-(28) | $SbF_6$ | $(CH(CH_3)CH_2CH_2CH(CH_3))_2(CH_2CH_2CH_2CH_3)$ | (H,H,H) |
| II-[1]-(29) | $AsF_6$ | $(CH(CH_3)CH_2OCH(CH_3)CH_2)(CH_2-CO-CO-CH_2)_2$ | (H,H,H) |
| II-[1]-(30) | Cl | $(C(CH_3)_2CH_2CH_2C(CH_3)_2)_3$ | (H,H,H) |
| II-[1]-(31) | $ClO_4$ | $(C_2H_4OCH_3, C_2H_4OCH_3)_3$ | (H,H,H) |
| II-[1]-(32) | $SbF_6$ | $(CH_2CH=CH_2, CH_2CH=CH_2)_3$ | (H,H,H) |
| II-[1]-(33) | $AsF_6$ | $(C_3H_6OC_3H_7, C_3H_6OC_3H_7)_3$ | (H,H,H) |
| II-[1]-(34) | Br | $(C_2H_4CH=CH_2, C_2H_4CH=CH_2)_3$ | (H,H,H) |
| II-[1]-(35) | $SbF_6$ | $(CH_2OCH_3, CH_2OCH_3)_3$ | (H,H,H) |
| II-[1]-(36) | $NO_3$ | $(C_2H_4CHO, C_2H_4CHO)_3$ | (H,H,H) |
| II-[1]-(37) | Cl | $(C_2H_4C\equiv CH, C_2H_4C\equiv CH)_3$ | (H,H,H) |
| II-[1]-(38) | I | $(CH_2COCH_3, CH_2COCH_3)_3$ | (H,H,H) |
| II-[1]-(39) | $CH_3SO_3$ | $(C_3H_6OH, C_3H_6OH)_3$ | (H,H,H) |
| II-[1]-(40) | $ClO_4$ | $(C_2H_4CN, C_2H_4CN)_3$ | (H,H,H) |
| II-[1]-(41) | $BF_4$ | $(C_4H_8COOCH_3, C_4H_8COOCH_3)_3$ | (H,H,H) |
| II-[1]-(42) | $AsF_6$ | $(CH_2C\equiv CH, CH_2C\equiv CH)_3$ | (H,H,H) |
| II-[1]-(43) | $SbF_6$ | $(CH_2OC_2H_5, CH_2OC_2H_5)_3$ | (H,H,H) |
| II-[1]-(44) | Br | $(CH_2OC_3H_7, CH_2OC_3H_7)_3$ | (H,H,H)) |
| II-[1]-(45) | $ClO_4$ | $(C_3H_6CH=CH_2, C_3H_6CH=CH_2)_3$ | (H,H,H) |
| II-[1]-(46) | $SbF_6$ | $(C_2H_4OCH_3, C_2H_4OCH_3)_3$ | (H,H,H) |
| II-[1]-(47) | $ClO_4$ | $(CH_2CH=CH_2, CH_2CH=CH_2)_3$ | (H,H,H) |
| II-[1]-(48) | I | $(C_2H_4C\equiv CH, C_2H_4C\equiv CH)_3$ | (H,H,H) |
| II-[1]-(49) | $SbF_6$ | $(C_2H_4OC_2H_5, C_2H_4OC_2H_5)_3$ | (H,H,H) |
| II-[1]-(50) | $BF_4$ | $(CH_2CH=CH_2, CH_2CH=CH_2)_3$ | (H,H,H) |
| II-[1]-(51) | $AsF_6$ | $(CH_2CH(CH_3)CH_2OCH_3, CH_2CH(CH_3)CH_2OCH_3)_3$ | (H,H,H) |
| II-[1]-(52) | 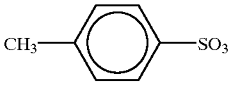 | $(C_3H_6CN, C_3H_6CN)_3$ | (H,H,H) |
| II-[1]-(53) | $ClO_4$ | $(4-C_6H_4CH_3, 4-C_6H_4CH_3)_3$ | (H,H,H) |
| II-[1]-(54) | $SbF_6$ | $(4-C_6H_4Cl, 4-C_6H_4Cl)_3$ | (H,H,H) |
| II-[1]-(55) | I | $(4-C_6H_4NH_2, 4-C_6H_4NH_2)_3$ | (H,H,H) |
| II-[1]-(56) | $ClO_4$ | $(4-C_6H_4N(CH_2)_2, 4-C_6H_4N(CH_3)_2)_3$ | (H,H,H) |
| II-[1]-(57) | Br | $(C_6H_{11}, C_6H_{11})_3$ | (H,H,H) |
| II-[1]-(58) | $NO_3$ | $(C_5H_9, C_5H_9)_3$ | (H,H,H) |
| II-[1]-(59) | $SbF_6$ | $(C_5H_{10}OCH_3, C_5H_{10}OCH_3)_3$ | (H,H,H) |
| II-[1]-(60) | $ClO_4$ | $(C_2H_4OC_2H_4, C_2H_4OC_2H_5)_3$ | (H,H,H) |
| II-[1]-(61) | $SbF_6$ | $(C_2H_4OCH_2, C_2H_4OCH_3)_2(C_2H_5, C_2H_5)$ | (H,H,H) |
| II-[1]-(62) | $AsF_6$ | $(C_2H_4OC_2H_5, C_2H_4OC_2H_5)(C_4H_9, C_4H_9)_2$ | (H,H,H) |
| II-[1]-(63) | I | $(C_3H_5OCH_3, C_3H_5OCH_3)H_7)_2$ | (H,H,H) |
| II-[1]-(64) | $ClO_4$ | $(CH_2CH=CH_3, CH_2CH=CH_3)_3$ | (H,H,H) |
| II-[1]-(65) | $SbF_6$ | $(CH_2OCH_3, CH_2OCH_3)_3$ | (H,H,H) |
| II-[1]-(66) | $ClO_4$ | $(C_2H_6, C_2H_6)$ $(C_3H_7, C_3H_7)$ $(C_2H_4OCH_3, C_2H_4OCH_3)$ | (H,H,H) |
| II-[1]-(67) | $PF_6$ | $(p-C_6H_4N(CH_3)_2,$ $p-C_6H_4N(CH_3)_2)_2(CH_2C\equiv CH, CH_2C\equiv CH)$ | (H,H,H) |
| II-[1]-(68) | $ClO_4$ | $(p-C_6H_4N(C_2H_5)_2,$ $p-C_6H_4N(C_2H_5)_2)_2(CH_2CH=CH_2, CH_2CH=CH_2$ | (H,H,H) |
| II-[1]-(69) | Br | $(C_2H_4OCH_3, C_2H_4OCH_3)_3$ | (H,H,H) |
| II-[1]-(70) | $SbF_6$ | $(C_2H_4CH=CH_2, C_2H_4CH=CH_2)_3$ | (H,H,H) |
| II-[1]-(71) | $AsF_6$ | $(C_2H_4OCH_3, C_2H_4OCH_3)_3$ | (H,H,H) |
| II-[1]-(72) | $AsF_6$ | $(CH_2OCH_3, CH_2OCH_3)_3$ | (H,H,H) |
| II-[1]-(73) | $ClO_4$ | $(CH_2C_6H_4CH_3, CH_2C_6H_4CH_3)_2(C_2H_4OH, C_2H_4OH)$ | (H,H,H) |
| II-[1]-(74) | $CH_3SO_3$ | $(C_6H_5, C_6H_5)$ $(CH_2CH=CH_2, CH_2CH=CH_2)_2$ | (H,H,H) |

| No. | $R_1$ | $R_2$ | $R_3$ | $R_4$ | $R_5$ | $R_6$ | $R_7$ | $R_9$ | $R_9$ |
|---|---|---|---|---|---|---|---|---|---|
| | | | | Examples of compounds represented by formula II-[1] (wherein, X = $SbF_6$) | | | | | |
| 75 | $CH_3$ | $CH_3$ | $CH_3$ | $CH_3$ | $CH_3$ | $CH_3$ | H | H | H |
| 76 | n-$C_4H_9$ | n-$C_4H_9$ | n-$C_4H_9$ | n-$C_4H_9$ | n-$C_4H_9$ | n-$C_4H_9$ | H | H | H |
| 77 | $C_2H_5$ | $C_2H_5$ | $C_2H_5$ | $C_2H_5$ | $C_2H_5$ | $C_2H_5$ | H | H | H |
| 78 | $CH_2C_6H_5$ | $CH_2C_6H_5$ | $CH_2C_6H_5$ | $CH_2C_6H_5$ | $CH_2C_6H_5$ | $CH_2C_6H_5$ | H | H | H |
| 79 | n-$C_3H_7$ | n-$C_3H_7$ | n-$C_3H_7$ | n-$C_3H_7$ | n-$C_3H_7$ | n-$C_3H_7$ | H | H | H |
| 80 | $C_2H_4Cl$ | $C_2H_4Cl$ | $C_2H_4Cl$ | $C_2H_4Cl$ | $C_2H_4Cl$ | $C_2H_4Cl$ | H | H | H |
| 81 | n-$C_6H_{13}$ | n-$C_6H_{13}$ | n-$C_6H_{13}$ | n-$C_6H_{13}$ | n-$C_6H_{13}$ | n-$C_6H_{13}$ | H | H | H |
| 82 | $C_6H_5$ | $C_6H_5$ | $C_6H_5$ | $C_6H_5$ | $C_6H_5$ | $C_6H_5$ | H | H | H |
| 83 | p-$C_6H_4Br$ | p-$C_6H_4Br$ | p-$C_6H_4Br$ | p-$C_6H_4Br$ | p-$C_6H_4Br$ | p-$C_6H_4Br$ | H | H | H |
| 84 | iso-$C_3H_7$ | iso-$C_3H_7$ | iso-$C_3H_7$ | iso-$C_3H_7$ | iso-$C_3H_7$ | iso-$C_3H_7$ | H | H | H |
| 85 | p-$C_6H_4OCH_3$ | p-$C_6H_4OCH_3$ | p-$C_6H_4OCH_3$ | p-$C_6H_4OCH_3$ | p-$C_6H_4OCH_3$ | P-$C_6H_4OCH_3$ | H | H | H |
| 86 | $CF_3$ | $CF_3$ | $CF_3$ | $CF_3$ | $CF_3$ | $CF_3$ | H | H | H |
| 87 | $CH_2CF_3$ | $CH_2CF_3$ | $CH_2CF_3$ | $CH_2CF_3$ | $CH_2CF_3$ | $CH_2CF_3$ | H | H | H |
| 88 | n-$C_5H_{11}$ | n-$C_5H_{11}$ | n-$C_5H_{11}$ | n-$C_5H_{11}$ | n-$C_5H_{11}$ | n-$C_5H_{11}$ | H | H | H |
| 89 | $C_2H_4OH$ | $C_2H_4OH$ | $C_2H_4OH$ | $C_2H_4OH$ | $C_2H_4OH$ | $C_2H_4OH$ | H | H | H |
| 90 | $CH_2COOCH_3$ | $CH_2COOCH_3$ | $CH_2COOCH_3$ | $CH_2COOCH_3$ | $CH_2COOCH_3$ | $CH_2COOCH_3$ | H | H | H |
| 91 | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | H | H | H |
| 92 | t-$C_4H_9$ | t-$C_4H_9$ | t-$C_4H_9$ | t-$C_4H_9$ | t-$C_4H_9$ | t-$C_4H_9$ | H | H | H |
| 93 | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | H | H | H |
| 94 | n-$C_3H_7$ | n-$C_3H_7$ | n-$C_3H_7$ | n-$C_3H_7$ | n-$C_3H_7$ | n-$C_3H_7$ | Br | Br | Br |
| 95 | $C_2H_5$ | $CH_3$ | $C_2H_5$ | $CH_3$ | $C_2H_5$ | $CH_3$ | H | H | H |
| 96 | n-$C_4H_9$ | n-$C_4H_9$ | n-$C_4H_9$ | n-$C_4H_9$ | n-$C_4H_9$ | n-$C_4H_9$ | $OCH_3$ | $OCH_3$ | $OCH_3$ |
| 97 | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | CN | CN | CN |
| 98 | n-$C_{12}H_{25}$ | n-$C_{12}H_{25}$ | n-$C_{12}H_{25}$ | n-$C_{12}H_{25}$ | n-$C_{12}H_{25}$ | n-$C_{12}H_{25}$ | H | H | H |
| 99 | n-$C_{10}H_{21}$ | n-$C_{10}H_{21}$ | n-$C_{10}H_{21}$ | n-$C_{10}H_{21}$ | n-$C_{10}H_{21}$ | n-$C_{10}H_{21}$ | H | H | H |
| 100 | $C_4H_8OH$ | $C_4H_8OH$ | $C_4H_8OH$ | $C_4H_8OH$ | $C_4H_8OH$ | $C_4H_8OH$ | H | H | H |
| 101 | 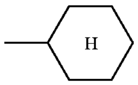 | 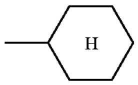 | 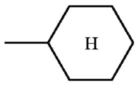 | 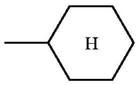 | 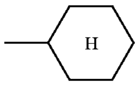 | 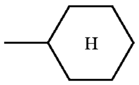 | H | H | H |
| 102 | $C_3F_7$ | $C_3F_7$ | $C_3F_7$ | $C_3F_7$ | $C_3F_7$ | $C_3F_7$ | H | H | H |
| 103 | $C_2H_4C_6H_5$ | $C_2H_4C_2H_5$ | $C_2H_4C_2H_5$ | $C_2H_4C_6H_5$ | $C_2H_4C_6H_5$ | $C_2H_4C_6H_5$ | H | H | H |
| 104 | n-$C_4H_9$ | n-$C_4H_9$ | $C_2H_5$ | $C_2H_5$ | $C_2H_5$ | $C_2H_5$ | H | H | H |
| 105 | n-$C_5H_{11}$ | n-$C_5H_{11}$ | n-$C_5H_{11}$ | n-$C_5H_{11}$ | n-$C_5H_{11}$ | n-$C_5H_{11}$ | OH | H | H |
| | | | | Examples of compounds represented by formula II-[1] (wherein, X = $PF_6$) | | | | | |
| 106 | $CH_3$ | $CH_3$ | $CH_3$ | $CH_3$ | $CH_3$ | $CH_3$ | H | H | H |
| 107 | n-$C_4H_9$ | n-$C_4H_9$ | n-$C_4H_9$ | n-$C_4H_9$ | n-$C_4H_9$ | n-$C_4H_9$ | H | H | H |
| 108 | $C_2H_5$ | $C_2H_5$ | $C_2H_5$ | $C_2H_5$ | $C_2H_5$ | $C_2H_5$ | H | H | H |
| 109 | $CH_2C_6H_5$ | $CH_2C_6H_5$ | $CH_2C_6H_5$ | $CH_2C_6H_5$ | $CH_2C_6H_5$ | $CH_2C_6H_5$ | H | H | H |
| 110 | n-$C_3H_7$ | n-$C_3H_7$ | n-$C_3H_7$ | n-$C_3H_7$ | n-$C_3H_7$ | n-$C_3H_7$ | H | H | H |
| 111 | $C_2H_4Cl$ | $C_2H_4Cl$ | $C_2H_4Cl$ | $C_2H_4Cl$ | $C_2H_4Cl$ | $C_2H_4Cl$ | H | H | H |
| 112 | n-$C_6H_{13}$ | n-$C_6H_{13}$ | n-$C_6H_{13}$ | n-$C_6H_{13}$ | n-$C_6H_{13}$ | n-$C_6H_{13}$ | H | H | H |
| 113 | $C_6H_5$ | $C_6H_5$ | $C_6H_5$ | $C_6H_5$ | $C_6H_5$ | $C_6H_5$ | H | H | H |

-continued

| No. | $R_1$ | $R_2$ | $R_3$ | $R_4$ | $R_5$ | $R_6$ | $R_7$ | $R_9$ | $R_9$ |
|---|---|---|---|---|---|---|---|---|---|
| 114 | p-$C_6H_4Br$ | p-$C_6H_4Br$ | p-$C_6H_4Br$ | p-$C_6H_4Br$ | p-$C_6H_4Br$ | p-$C_6H_4Br$ | H | H | H |
| 115 | iso-$C_3H_7$ | iso-$C_3H_7$ | iso-$C_3H_7$ | iso-$C_3H_7$ | iso-$C_3H_7$ | iso-$C_3H_7$ | H | H | H |
| 116 | p-$C_6H_4OCH_3$ | p-$C_6H_4OCH_3$ | p-$C_6H_4OCH_3$ | p-$C_6H_4OCH_3$ | p-$C_6H_4OCH_3$ | P-$C_6H_4OCH_3$ | H | H | H |
| 117 | $CF_3$ | $CF_3$ | $CF_3$ | $CF_3$ | $CF_3$ | $CF_3$ | H | H | H |
| 118 | $CH_2CF_3$ | $CH_2CF_3$ | $CH_2CF_3$ | $CH_2CF_3$ | $CH_2CF_3$ | $CH_2CF_3$ | H | H | H |
| 119 | n-$C_5H_{11}$ | n-$C_5H_{11}$ | n-$C_5H_{11}$ | n-$C_5H_{11}$ | n-$C_5H_{11}$ | n-$C_5H_{11}$ | H | H | H |
| 120 | $C_2H_4OH$ | $C_2H_4OH$ | $C_2H_4OH$ | $C_2H_4OH$ | $C_2H_4OH$ | $C_2H_4OH$ | H | H | H |
| 121 | $CH_2COOCH_3$ | $CH_2COOCH_3$ | $CH_2COOCH_3$ | $CH_2COOCH_3$ | $CH_2COOCH_3$ | $CH_2COOCH_3$ | H | H | H |
| 122 | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | H | H | H |
| 123 | t-$C_4H_9$ | t-$C_4H_9$ | t-$C_4H_9$ | t-$C_4H_9$ | t-$C_4H_9$ | t-$C_4H_9$ | H | H | H |
| 124 | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | H | H | H |
| 125 | n-$C_3H_7$ | n-$C_3H_7$ | n-$C_3H_7$ | n-$C_3H_7$ | n-$C_3H_7$ | n-$C_3H_7$ | Br | Br | Br |
| 126 | $C_2H_5$ | $CH_3$ | $C_2H_5$ | $CH_3$ | $C_2H_5$ | $CH_3$ | H | H | H |
| 127 | n-$C_4H_9$ | n-$C_4H_9$ | n-$C_4H_9$ | n-$C_4H_9$ | n-$C_4H_9$ | n-$C_4H_9$ | $OCH_3$ | $OCH_3$ | $OCH_3$ |
| 128 | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | CN | CN | CN |
| 129 | n-$C_{12}H_{25}$ | n-$C_{12}H_{25}$ | n-$C_{12}H_{25}$ | n-$C_{12}H_{25}$ | n-$C_{12}H_{25}$ | n-$C_{12}H_{25}$ | H | H | H |
| 130 | n-$C_{10}H_{21}$ | n-$C_{10}H_{21}$ | n-$C_{10}H_{21}$ | n-$C_{10}H_{21}$ | n-$C_{10}H_{21}$ | n-$C_{10}H_{21}$ | H | H | H |
| 131 | $C_4H_8OH$ | $C_4H_8OH$ | $C_4H_8OH$ | $C_4H_8OH$ | $C_4H_8OH$ | $C_4H_8OH$ | H | H | H |
| 132 | 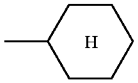 | 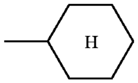 | 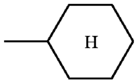 | 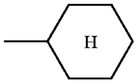 | 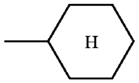 | 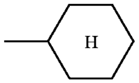 | H | H | H |
| 133 | $C_3F_7$ | $C_3F_7$ | $C_3F_7$ | $C_3F_7$ | $C_3F_7$ | $C_3F_7$ | H | H | H |
| 134 | $C_2H_4C_6H_5$ | $C_2H_4C_2H_5$ | $C_2H_4C_2H_5$ | $C_2H_4C_6H_5$ | $C_2H_4C_6H_5$ | $C_2H_4C_6H_5$ | H | H | H |
| 135 | n-$C_4H_9$ | n-$C_4H_9$ | $C_2H_5$ | $C_2H_5$ | $C_2H_5$ | $C_2H_5$ | H | H | H |
| 136 | n-$C_5H_{11}$ | n-$C_5H_{11}$ | n-$C_5H_{11}$ | n-$C_5H_{11}$ | n-$C_5H_{11}$ | n-$C_5H_{11}$ | OH | H | H |
| | | | Examples of compounds represented by formula II-[1] (wherein, X = $ClO_4$) | | | | | | |
| 137 | $CH_3$ | $CH_3$ | $CH_3$ | $CH_3$ | $CH_3$ | $CH_3$ | H | H | H |
| 138 | n-$C_4H_9$ | n-$C_4H_9$ | n-$C_4H_9$ | n-$C_4H_9$ | n-$C_4H_9$ | n-$C_4H_9$ | H | H | H |
| 139 | $C_2H_5$ | $C_2H_5$ | $C_2H_5$ | $C_2H_5$ | $C_2H_5$ | $C_2H_5$ | H | H | H |
| 140 | $CH_2C_6H_5$ | $CH_2C_6H_5$ | $CH_2C_6H_5$ | $CH_2C_6H_5$ | $CH_2C_6H_5$ | $CH_2C_6H_5$ | H | H | H |
| 141 | n-$C_3H_7$ | n-$C_3H_7$ | n-$C_3H_7$ | n-$C_3H_7$ | n-$C_3H_7$ | n-$C_3H_7$ | H | H | H |
| 142 | $C_2H_4Cl$ | $C_2H_4Cl$ | $C_2H_4Cl$ | $C_2H_4Cl$ | $C_2H_4Cl$ | $C_2H_4Cl$ | H | H | H |
| 143 | n-$C_6H_{13}$ | n-$C_6H_{13}$ | n-$C_6H_{13}$ | n-$C_6H_{13}$ | n-$C_6H_{13}$ | n-$C_6H_{13}$ | H | H | H |
| 144 | $C_6H_5$ | $C_6H_5$ | $C_6H_5$ | $C_6H_5$ | $C_6H_5$ | $C_6H_5$ | H | H | H |
| 145 | p-$C_6H_4Br$ | p-$C_6H_4Br$ | p-$C_6H_4Br$ | p-$C_6H_4Br$ | p-$C_6H_4Br$ | p-$C_6H_4Br$ | H | H | H |
| 146 | iso-$C_3H_7$ | iso-$C_3H_7$ | iso-$C_3H_7$ | iso-$C_3H_7$ | iso-$C_3H_7$ | iso-$C_3H_7$ | H | H | H |
| 147 | p-$C_6H_4OCH_3$ | p-$C_6H_4OCH_3$ | p-$C_6H_4OCH_3$ | p-$C_6H_4OCH_3$ | p-$C_6H_4OCH_3$ | P-$C_6H_4OCH_3$ | H | H | H |
| 148 | $CF_3$ | $CF_3$ | $CF_3$ | $CF_3$ | $CF_3$ | $CF_3$ | H | H | H |
| 149 | $CH_2CF_3$ | $CH_2CF_3$ | $CH_2CF_3$ | $CH_2CF_3$ | $CH_2CF_3$ | $CH_2CF_3$ | H | H | H |
| 150 | n-$C_5H_{11}$ | n-$C_5H_{11}$ | n-$C_5H_{11}$ | n-$C_5H_{11}$ | n-$C_5H_{11}$ | n-$C_5H_{11}$ | H | H | H |
| 151 | $C_2H_4OH$ | $C_2H_4OH$ | $C_2H_4OH$ | $C_2H_4OH$ | $C_2H_4OH$ | $C_2H_4OH$ | H | H | H |
| 152 | $CH_2COOCH_3$ | $CH_2COOCH_3$ | $CH_2COOCH_3$ | $CH_2COOCH_3$ | $CH_2COOCH_3$ | $CH_2COOCH_3$ | H | H | H |
| 153 | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | H | H | H |
| 154 | t-$C_4H_9$ | t-$C_4H_9$ | t-$C_4H_9$ | t-$C_4H_9$ | t-$C_4H_9$ | t-$C_4H_9$ | H | H | H |
| 155 | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | H | H | H |

-continued

| No. | $R_1$ | $R_2$ | $R_3$ | $R_4$ | $R_5$ | $R_6$ | $R_7$ | $R_9$ | $R_9$ |
|---|---|---|---|---|---|---|---|---|---|
| 156 | n-$C_3H_7$ | n-$C_3H_7$ | n-$C_3H_7$ | n-$C_3H_7$ | n-$C_3H_7$ | n-$C_3H_7$ | Br | Br | Br |
| 157 | $C_2H_5$ | $CH_3$ | $C_2H_5$ | $CH_3$ | $C_2H_5$ | $CH_3$ | H | H | H |
| 158 | n-$C_4H_9$ | n-$C_4H_9$ | n-$C_4H_9$ | n-$C_4H_9$ | n-$C_4H_9$ | n-$C_4H_9$ | $OCH_3$ | $OCH_3$ | $OCH_3$ |
| 159 | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | CN | CN | CN |
| 160 | n-$C_{12}H_{25}$ | n-$C_{12}H_{25}$ | n-$C_{12}H_{25}$ | n-$C_{12}H_{25}$ | n-$C_{12}H_{25}$ | n-$C_{12}H_{25}$ | H | H | H |
| 161 | n-$C_{10}H_{21}$ | n-$C_{10}H_{21}$ | n-$C_{10}H_{21}$ | n-$C_{10}H_{21}$ | n-$C_{10}H_{21}$ | n-$C_{10}H_{21}$ | H | H | H |
| 162 | $C_4H_8OH$ | $C_4H_8OH$ | $C_4H_8OH$ | $C_4H_8OH$ | $C_4H_8OH$ | $C_4H_8OH$ | H | H | H |
| 163 | 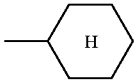 | 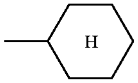 | 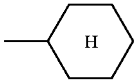 | 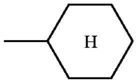 | 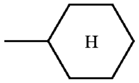 | 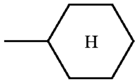 | H | H | H |
| 164 | $C_3F_7$ | $C_3F_7$ | $C_3F_7$ | $C_3F_7$ | $C_3F_7$ | $C_3F_7$ | H | H | H |
| 165 | $C_2H_4C_6H_5$ | $C_2H_4C_2H_5$ | $C_2H_4C_2H_5$ | $C_2H_4C_6H_5$ | $C_2H_4C_6H_5$ | $C_2H_4C_6H_5$ | H | H | H |
| 166 | n-$C_4H_9$ | n-$C_4H_9$ | $C_2H_5$ | $C_2H_5$ | $C_2H_5$ | $C_2H_5$ | H | H | H |
| 167 | n-$C_5H_{11}$ | n-$C_5H_{11}$ | n-$C_5H_{11}$ | n-$C_5H_{11}$ | n-$C_5H_{11}$ | n-$C_5H_{11}$ | OH | H | H |

-continued

| Compound No. | X | $(R_1R_2)$ $(R_3R_4)$ $(R_5R_6)$ | $(R_7R_8R_9)$ |
|---|---|---|---|
| II - [2] - (1) | $AsF_6$ | $(CH_2CH_2CH_2CH_2CH_2)3$ | (H,H,H) |
| II - [2] - (2) | $SbF_6$ | $(CH(CH_3)CH_2CH_2CH_2)_3$ | (H,H,H) |
| II - [2] - (3) | $ClO_4$ | $(CH_2CH_2OCH_2CH_2)_3$ | (H,H,H) |
| II - [2] - (4) | $ClO_4$ | $(CH{=}C(CH_3)CH_2C(CH_3)_2CH_2)_3$ | (H,H,H) |
| II - [2] - (5) | I | $(CH(CH_3)CH_2CH_2CH(CH_3))_3$ | (H,H,H) |
| II - [2] - (6) | Br | $(CH_2CH(OH)—CH(OH)CH_2)_3$ | (H,H,H) |
| II - [2] - (7) | $SbF_6$ | $(CH_2—CO—CO—CH_2)_3$ | (H,H,H) |
| II - [2] - (8) | $BF_4$ | $(CH_2CH_2CH(OH)CH_2)_3$ | (H,H,H) |
| II - [2] - (9) | $NO_3$ | $(CH_2CH{=}CHCH_2)_3$ | (H,H,H) |
| II - [2] - (10) | $AsF_6$ | $(CH(CH_3)—CO—CO—CH(CH_3))_3$ | (H,H,H) |
| II - [2] - (11) | $ClO_4$ | $(CH_2CH_2CH_2CH_2)_3$ | (H,H,H) |
| II - [2] - (12) | Cl | $(CH_2CH_2CF_2CF_2)_3$ | (H,H,H) |
| II - [2] - (13) | $SbF_6$ | $(CH_2C{\equiv}CCH_2)_3$ | (H,H,H) |
| II - [2] - (14) | I | $(C(CH_3)_2CH_2CH_2CH_2)_3$ | (H,H,H) |
| II - [2] - (15) | $AsF_6$ | $(CH_2CH_2SCH_2CH_2)_3$ | (H,H,H) |
| II - [2] - (16) | $ClO_4$ | $(C_2H_4OCH_3,\ C_2H_4OCH_3)_3$ | (H,H,H) |
| II - [2] - (17) | $SbF_6$ | $(CH_2CH{=}CH_2,\ CH_2CH{=}CH_2)_3$ | (H,H,H) |
| II - [2] - (18) | $AsF_6$ | $(C_3H_6OC_3H_7,\ C_3H_6OC_3H_7)_3$ | (H,H,H) |
| II - [2] - (19) | Br | $(C_2H_4CH{=}CH_2,\ C_2H_4CH{=}CH_2)_3$ | (H,H,H) |
| II - [2] - (20) | $SbF_6$ | $(CH_2OCH_3,\ CH_2OCH_3)_3$ | (H,H,H) |
| II - [2] - (21) | $NO_3$ | $(C_2H_4CHO,\ C_2H_4CHO)_3$ | (H,H,H) |
| II - [2] - (22) | Cl | $(C_2H_4C{\equiv}CH,\ C_2H_4C{=}CH)_3$ | (H,H,H) |
| II - [2] - (23) | I | $(CH_2COCH_3,\ CH_2COCH_3)_3$ | (H,H,H) |
| II - [2] - (24) | $CH_3SO_3$ | $(C_3H_6OH,\ C_3H_6OH)_3$ | (H,H,H) |
| II - [2] - (25) | $ClO_4$ | $(C_2H_4CN,\ C_2H_4CN)_3$ | (H,H,H) |
| II - [2] - (26) | $BF_4$ | $(C_2H_4OCH_3,\ C_2H_4OCH_3)_3$ | (H,H,H) |
| II - [2] - (27) | $AsF_6$ | $(CH_2C{\equiv}CH,\ CH_2C{\equiv}CH)_3$ | (H,H,H) |
| II - [2] - (28) | $SbF_6$ | $(CH_2OC_2H_5,\ CH_2OC_2H_5)_3$ | (H,H,H) |
| II - [2] - (29) | $SbF_6$ | $(C_2H_4OCH_3,\ C_2H_4OCH_3)_3$ | (H,H,H) |
| II - [2] - (30) | $ClO_4$ | $(C_3H_6CH{=}CH_2,\ C_3H_6CH{=}CH_2)_3$ | (H,H,H) |

| No. | $R_1$ | $R_2$ | $R_3$ | $R_4$ | $R_5$ | $R_6$ | $R_7$ | $R_8$ | $R_9$ |
|---|---|---|---|---|---|---|---|---|---|
| | | | Examples of compounds represented by formula II-[2] (wherein, $X = SbF_6$) | | | | | | |
| 31 | $CH_3$ | $CH_3$ | $CH_3$ | $CH_3$ | $CH_3$ | $CH_3$ | H | H | H |
| 32 | n-$C_4H_9$ | n-$C_4H_9$ | n-$C_4H_9$ | n-$C_4H_9$ | n-$C_4H_9$ | n-$C_4H_9$ | H | H | H |
| 33 | $C_2H_5$ | $C_2H_5$ | $C_2H_5$ | $C_2H_5$ | $C_2H_5$ | $C_2H_5$ | H | H | H |
| 34 | $CH_2C_6H_5$ | $CH_2C_6H_5$ | $CH_2C_6H_5$ | $CH_2C_6H_5$ | $CH_2C_6H_5$ | $CH_2C_6H_5$ | H | H | H |
| 35 | n-$C_3H_7$ | n-$C_3H_7$ | n-$C_3H_7$ | n-$C_3H_7$ | n-$C_3H_7$ | n-$C_3H_7$ | H | H | H |
| 36 | $C_2H_4Cl$ | $C_2H_4Cl$ | $C_2H_4Cl$ | $C_2H_4Cl$ | $C_2H_4Cl$ | $C_2H_4Cl$ | H | H | H |
| 37 | n-$C_6H_{13}$ | n-$C_6H_{13}$ | n-$C_6H_{13}$ | n-$C_6H_{13}$ | n-$C_6H_{13}$ | n-$C_6H_{13}$ | H | H | H |
| 38 | $C_6H_5$ | $C_6H_5$ | $C_6H_5$ | $C_6H_5$ | $C_6H_5$ | $C_6H_5$ | H | H | H |
| 39 | p-$C_6H_4Br$ | p-$C_6H_4Br$ | p-$C_6H_4Br$ | p-$C_6H_4Br$ | p-$C_6H_4Br$ | p-$C_6H_4Br$ | H | H | H |
| 40 | iso-$C_3H_7$ | iso-$C_3H_7$ | iso-$C_3H_7$ | iso-$C_3H_7$ | iso-$C_3H_7$ | iso-$C_3H_7$ | H | H | H |
| 41 | p-$C_6H_4OCH_3$ | p-$C_6H_4OCH_3$ | p-$C_6H_4OCH_3$ | p-$C_6H_4OCH_3$ | p-$C_6H_4OCH_3$ | p-$C_6H_4OCH_3$ | H | H | H |
| 42 | $CF_3$ | $CF_3$ | $CF_3$ | $CF_3$ | $CF_3$ | $CF_3$ | H | H | H |
| 43 | $CH_2CF_3$ | $CH_2CF_3$ | $CH_2CF_3$ | $CH_2CF_3$ | $CH_2CF_3$ | $CH_2CF_3$ | H | H | H |
| 44 | n-$C_5H_{11}$ | n-$C_5H_{11}$ | n-$C_5H_{11}$ | n-$C_5H_{11}$ | n-$C_5H_{11}$ | n-$C_5H_{11}$ | H | H | H |
| 45 | $C_2H_4OH$ | $C_2H_4OH$ | $C_2H_4OH$ | $C_2H_4OH$ | $C_2H_4OH$ | $C_2H_4OH$ | H | H | H |
| 46 | $CH_2COOCH_3$ | $CH_2COOCH_3$ | $CH_2COOCH_3$ | $CH_2COOCH_3$ | $CH_2COOCH_3$ | $CH_2COOCH_3$ | H | H | H |
| 47 | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | H | H | H |
| 48 | t-$C_4H_9$ | t-$C_4H_9$ | t-$C_4H_9$ | t-$C_4H_9$ | t-$C_4H_9$ | t-$C_4H_9$ | H | H | H |
| 49 | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | H | H | H |
| 50 | n-$C_3H_7$ | n-$C_3H_7$ | n-$C_3H_7$ | n-$C_3H_7$ | n-$C_3H_7$ | n-$C_3H_7$ | Br | Br | Br |
| 51 | $C_2H_5$ | $CH_3$ | $C_2H_5$ | $CH_3$ | $C_2H_5$ | $CH_3$ | H | H | H |
| 52 | n-$C_4H_9$ | n-$C_4H_9$ | n-$C_4H_9$ | n-$C_4H_9$ | n-$C_4H_9$ | n-$C_4H_9$ | $OCH_3$ | $OCH_3$ | $OCH_3$ |
| 53 | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | CN | CN | CN |
| 54 | n-$C_{12}H_{25}$ | n-$C_{12}H_{25}$ | n-$C_{12}H_{25}$ | n-$C_{12}H_{25}$ | n-$C_{12}H_{25}$ | n-$C_{12}H_{25}$ | H | H | H |
| 55 | n-$C_{10}H_{21}$ | n-$C_{10}H_{21}$ | n-$C_{10}H_{21}$ | n-$C_{10}H_{21}$ | n-$C_{10}H_{21}$ | n-$C_{10}H_{21}$ | H | H | H |
| 56 | $C_4H_8OH$ | $C_4H_8OH$ | $C_4H_8OH$ | $C_4H_8OH$ | $C_4H_8OH$ | $C_4H_8OH$ | H | H | H |
| 57 | 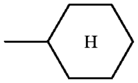 | 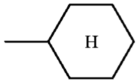 | 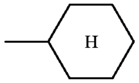 | 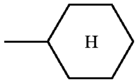 | 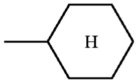 | 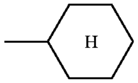 | H | H | H |
| 58 | $C_3F_7$ | $C_3F_7$ | $C_3F_7$ | $C_3F_7$ | $C_3F_7$ | $C_3F_7$ | H | H | H |
| 59 | $C_2H_4C_6H_5$ | $C_2H_4C_6H_5$ | $C_2H_4C_6H_5$ | $C_2H_4C_6H_5$ | $C_2H_4C_6H_5$ | $C_2H_4C_6H_5$ | H | H | H |
| 60 | n-$C_4H_9$ | n-$C_4H_9$ | $C_2H_5$ | $C_2H_5$ | $C_2H_5$ | $C_2H_5$ | H | H | H |
| 61 | n-$C_5H_{11}$ | n-$C_5H_{11}$ | n-$C_5H_{11}$ | n-$C_5H_{11}$ | n-$C_5H_{11}$ | n-$C_5H_{11}$ | OH | H | H |
| | | | Examples of compounds represented by formula II-[2] (wherein, $X = PF_6$) | | | | | | |
| 62 | $CH_3$ | $CH_3$ | $CH_3$ | $CH_3$ | $CH_3$ | $CH_3$ | H | H | H |
| 63 | n-$C_4H_9$ | n-$C_4H_9$ | n-$C_4H_9$ | n-$C_4H_9$ | n-$C_4H_9$ | n-$C_4H_9$ | H | H | H |
| 64 | $C_2H_5$ | $C_2H_5$ | $C_2H_5$ | $C_2H_5$ | $C_2H_5$ | $C_2H_5$ | H | H | H |
| 65 | $CH_2C_6H_5$ | $CH_2C_6H_5$ | $CH_2C_6H_5$ | $CH_2C_6H_5$ | $CH_2C_6H_5$ | $CH_2C_6H_5$ | H | H | H |
| 66 | n-$C_3H_7$ | n-$C_3H_7$ | n-$C_3H_7$ | n-$C_3H_7$ | n-$C_3H_7$ | n-$C_3H_7$ | H | H | H |
| 67 | $C_2H_4Cl$ | $C_2H_4Cl$ | $C_2H_4Cl$ | $C_2H_4Cl$ | $C_2H_4Cl$ | $C_2H_4Cl$ | H | H | H |
| 68 | n-$C_6H_{13}$ | n-$C_6H_{13}$ | n-$C_6H_{13}$ | n-$C_6H_{13}$ | n-$C_6H_{13}$ | n-$C_6H_{13}$ | H | H | H |
| 69 | $C_6H_5$ | $C_6H_5$ | $C_6H_5$ | $C_6H_5$ | $C_6H_5$ | $C_6H_5$ | H | H | H |

-continued

| No. | $R_1$ | $R_2$ | $R_3$ | $R_4$ | $R_5$ | $R_6$ | $R_7$ | $R_8$ | $R_9$ |
|---|---|---|---|---|---|---|---|---|---|
| 70 | p-$C_6H_4Br$ | p-$C_6H_4Br$ | p-$C_6H_4Br$ | p-$C_6H_4Br$ | p-$C_6H_4Br$ | p-$C_6H_4Br$ | H | H | H |
| 71 | iso-$C_3H_7$ | iso-$C_3H_7$ | iso-$C_3H_7$ | iso-$C_3H_7$ | iso-$C_3H_7$ | iso-$C_3H_7$ | H | H | H |
| 72 | p-$C_6H_4OCH_3$ | p-$C_6H_4OCH_3$ | p-$C_6H_4OCH_3$ | p-$C_6H_4OCH_3$ | p-$C_6H_4OCH_3$ | p-$C_6H_4OCH_3$ | H | H | H |
| 73 | $CF_3$ | $CF_3$ | $CF_3$ | $CF_3$ | $CF_3$ | $CF_3$ | H | H | H |
| 74 | $CH_2CF_3$ | $CH_2CF_3$ | $CH_2CF_3$ | $CH_2CF_3$ | $CH_2CF_3$ | $CH_2CF_3$ | H | H | H |
| 75 | n-$C_5H_{11}$ | n-$C_5H_{11}$ | n-$C_5H_{11}$ | n-$C_5H_{11}$ | n-$C_5H_{11}$ | n-$C_5H_{11}$ | H | H | H |
| 76 | $C_2H_4OH$ | $C_2H_4OH$ | $C_2H_4OH$ | $C_2H_4OH$ | $C_2H_4OH$ | $C_2H_4OH$ | H | H | H |
| 77 | $CH_2COOCH_3$ | $CH_2COOCH_3$ | $CH_2COOCH_3$ | $CH_2COOCH_3$ | $CH_2COOCH_3$ | $CH_2COOCH_3$ | H | H | H |
| 78 | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | H | H | H |
| 79 | t-$C_4H_9$ | t-$C_4H_9$ | t-$C_4H_9$ | t-$C_4H_9$ | t-$C_4H_9$ | t-$C_4H_9$ | H | H | H |
| 80 | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | H | H | H |
| 81 | n-$C_3H_7$ | n-$C_3H_7$ | n-$C_3H_7$ | n-$C_3H_7$ | n-$C_3H_7$ | n-$C_3H_7$ | Br | Br | Br |
| 82 | $C_2H_5$ | $CH_3$ | $C_2Hs$ | $CH_3$ | $C_2H_5$ | $CH_3$ | H | H | H |
| 83 | n-$C_4H_9$ | n-$C_4H_9$ | n-$C_4H_9$ | n-$C_4H_9$ | n-$C_4H_9$ | n-$C_4H_9$ | $OCH_3$ | $OCH_3$ | $OCH_3$ |
| 84 | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | CN | CN | CN |
| 85 | n-$C_{12}H_{25}$ | n-$C_{12}H_{25}$ | n-$C_{12}H_{25}$ | n-$C_{12}H_{25}$ | n-$C_{12}H_{25}$ | n -$C_{12}H_{25}$ | H | H | H |
| 86 | n-$C_{10}H_{21}$ | n-$C_{10}H_{21}$ | n-$C_{10}H_{21}$ | n-$C_{10}H_{21}$ | n-$C_{10}H_{21}$ | n-$C_{10}H_{21}$ | H | H | H |
| 87 | $C_4H_8OH$ | $C_4H_8OH$ | $C_4H_8OH$ | $C_4H_8OH$ | $C_4H_8OH$ | $C_4H_8OH$ | H | H | H |
| 88 | 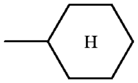 | 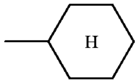 | 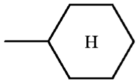 | 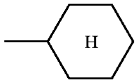 | 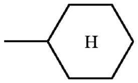 | 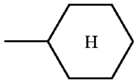 | H | H | H |
| 89 | $C_3F_7$ | $C_3F_7$ | $C_3F_7$ | $C_3F_7$ | $C_3F_7$ | $C_3F_7$ | H | H | H |
| 90 | $C_2H_4C_6H_5$ | $C_2H_4C_6H_5$ | $C_2H_4C_6H_5$ | $C_2H_4C_6H_5$ | $C_2H_4C_6H_5$ | $C_2H_4C_6H_5$ | H | H | H |
| 91 | n-$C_4H_9$ | n-$C_4H_9$ | $C_2Hs$ | $C_2H_5$ | $C_2H_5$ | $C_2H_5$ | H | H | H |
| 92 | n-$C_5H_{11}$ | n-$C_5H_{11}$ | n-$C_5H_{11}$ | n-$C_5H_{11}$ | n-$C_5H_{11}$ | n-$C_5H_{11}$ | OH | H | H |

Examples of compounds represented by formula II-[2] (wherein, X = $ClO_4$)

| | | | | | | | | | |
|---|---|---|---|---|---|---|---|---|---|
| 93 | $CH_3$ | $CH_3$ | $CH_3$ | $CH_3$ | $CH_3$ | $CH_3$ | H | H | H |
| 94 | n-$C_4H_9$ | n-$C_4H_9$ | n-$C_4H_9$ | n-$C_4H_9$ | n-$C_4H_9$ | n-$C_4H_9$ | H | H | H |
| 95 | $C_2H_5$ | $C_2H_5$ | $C_2H_5$ | $C_2H_5$ | $C_2H_5$ | $C_2H_5$ | H | H | H |
| 96 | $CH_2C_6H_5$ | $CH_2C_6H_5$ | $CH_2C6Hs$ | $CH_2C_6H_5$ | $CH_2C_6H_5$ | $CH_2C_6H_5$ | H | H | H |
| 97 | n-$C_3H_7$ | n-$C_3H_7$ | n-$C_3H_7$ | n-$C_3H_7$ | n-$C_3H_7$ | n-$C_3H_7$ | H | H | H |
| 98 | $C_2H_4Cl$ | $C_2H_4Cl$ | $C_2H_4Cl$ | $C_2H_4Cl$ | $C_2H_4Cl$ | $C_2H_4Cl$ | H | H | H |
| 99 | n-$C_6H_{13}$ | n-$C_6H_{13}$ | n-$C_6H_{13}$ | n-$C_6H_{13}$ | n-$C_6H_{13}$ | n-$C_6H_{13}$ | H | H | H |
| 100 | $C_6H_5$ | $C_6H_5$ | $C_6H_5$ | $C_6H_5$ | $C_6H_5$ | $C_6H_5$ | H | H | H |
| 101 | p-$C_6H_4Br$ | p-$C_6H_4Br$ | p-$C_6H_4Br$ | p-$C_6H_4Br$ | p-$C_6H_4Br$ | p-$C_6H_4Br$ | H | H | H |
| 102 | iso-$C_3H_7$ | iso-$C_3H_7$ | iso-$C_3H_7$ | iso-$C_3H_7$ | iso-$C_3H_7$ | iso-$C_3H_7$ | H | H | H |
| 103 | p-$C_6H_4OCH_3$ | p-$C_6H_4OCH_3$ | p-$C_6H_4OCH_3$ | p-$C_6H_4OCH_3$ | p-$C_6H_4OCH_3$ | p-$C_6H_4OCH_3$ | H | H | H |
| 104 | $CF_3$ | $CF_3$ | $CF_3$ | $CF_3$ | $CF_3$ | $CF_3$ | H | H | H |
| 105 | $CH_2CF_3$ | $CH_2CF_3$ | $CH_2CF_3$ | $CH_2CF_3$ | $CH_2CF_3$ | $CH_2CF_3$ | H | H | H |
| 106 | n-$C_5H_{11}$ | n-$C_5H_{11}$ | n-$C_5H_{11}$ | n-$C_5H_{11}$ | n-$C_5H_{11}$ | n-$C_5H_{11}$ | H | H | H |
| 107 | $C_2H_4OH$ | $C_2H_4OH$ | $C_2H_4OH$ | $C_2H_4OH$ | $C_2H_4OH$ | $C_2H_4OH$ | H | H | H |
| 108 | $CH_2COOCH_3$ | $CH_2COOCH_3$ | $CH_2COOCH_3$ | $CH_2COOCH_3$ | $CH_2COOCH_3$ | $CH_2COOCH_3$ | H | H | H |
| 109 | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | p-$C_6H_4N(Et)_2$ | H | H | H |
| 110 | t-$C_4H_9$ | t-$C_4H_9$ | t-$C_4H_9$ | t-$C_4H_9$ | t-$C_4H_9$ | t-$C_4H_9$ | H | H | H |
| 111 | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | $C_2H_4CH(CH_3)CH_3$ | H | H | H |

-continued

| No. | $R_1$ | $R_2$ | $R_3$ | $R_4$ | $R_5$ | $R_6$ | $R_7$ | $R_8$ | $R_9$ |
|---|---|---|---|---|---|---|---|---|---|
| 112 | n-$C_3H_7$ | n-$C_3H_7$ | n-$C_3H_7$ | n-$C_3H_7$ | n-$C_3H_7$ | n-$C_3H_7$ | Br | Br | Br |
| 113 | $C_2H_5$ | $CH_3$ | $C_2H_5$ | $CH_3$ | $C_2H_5$ | $CH_3$ | H | H | H |
| 114 | n-$C_4H_9$ | n-$C_4H_9$ | n-$C_4H_9$ | n-$C_4H_9$ | n-$C_4H_9$ | n-$C_4H_9$ | $OCH_3$ | $OCH_3$ | $OCH_3$ |
| 115 | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | p-$C_6H_4N(Me)_2$ | CN | CN | CN |
| 116 | n-$C_{12}H_{25}$ | n-$C_{12}H_{25}$ | n-$C_{12}H_{25}$ | n-$C_{12}H_{25}$ | n-$C_{12}H_{25}$ | n-$C_{12}H_{25}$ | H | H | H |
| 117 | n-$C_{10}H_{21}$ | n-$C_{10}H_{21}$ | n-$C_{10}H_{21}$ | n-$C_{10}H_{21}$ | n-$C_{10}H_{21}$ | n-$C_{10}H_{21}$ | H | H | H |
| 118 | $C_4H_8OH$ | $C_4H_8OH$ | $C_4H_8OH$ | $C_4H_8OH$ | $C_4H_8OH$ | $C_4H_8OH$ | H | H | H |
| 119 | 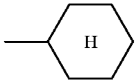 | 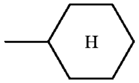 | 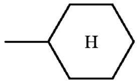 | 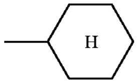 | 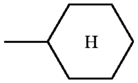 | 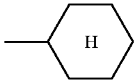 | H | H | H |
| 120 | $C_3F_7$ | $C_3F_7$ | $C_3F_7$ | $C_3F_7$ | $C_3F_7$ | $C_3F_7$ | H | H | H |
| 121 | $C_2H_4C_6H_5$ | $C_2H_4C_6H_5$ | $C_2H_4C_6H_5$ | $C_2H_4C_6H_5$ | $C_2H_4C_6H_5$ | $C_2H_4C_6H_5$ | H | H | H |
| 122 | n-$C_4H_9$ | n-$C_4H_9$ | $C_2H_5$ | $C_2H_5$ | $C_2H_5$ | $C_2H_5$ | H | H | H |
| 123 | n-$C_5H_{11}$ | n-$C_5H_{11}$ | n-$C_5H_{11}$ | n-$C_5H_{11}$ | n-$C_5H_{11}$ | n-$C_5H_{11}$ | OH | H | H |

Substance Which Absorbs Light and Generates Heat

In the first aspect of the present invention, various pigments or dyes can be added as needed.

Further, in the second aspect of the present invention as well, a substance which absorbs light such as a laser beam and generates heat, an infrared ray absorber for example, can be contained in an image forming material. By adding such an infrared ray absorber, it is possible to heat laser-irradiated portions, promote the decomposition of the compound represented by either of the general formulae II-[1] and II-[2] of the present invention (a substance decomposed by light and heat), and improve sensitivity of the image forming material.

As such a substance, various pigments or dyes are used.

Example of pigments used in the first and second aspects of the present invention include commercially available pigments and those disclosed in the Color Index (C. I.) Manual; "Saishin Ganryo Binran (Modern Pigment Manual)" edited by Nippon Ganryo Gijutsu Kyokai (Japan Pigment Technology Association), published in 1977; "Saishin Ganryo Oyo Gijutsu (Modern Pigment Application Technology)" by CMC Press, published in 1986; and "Insatsu Ink Gijutsu (Printing Ink Technology)" by CMC Press, published in 1984.

Examples of pigments include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, carbon black, and the like can be used.

These pigments can be used with or without surface treatment. Examples of surface treatment methods include a method of surface coating with a resin or a wax, a method of adhering a surfactant, and a method of bonding a reactive substance (such as a silane coupling agent, an epoxy compound, polyisocyanate, or the like) with the pigment surface. The above-mentioned surface treatment methods are disclosed in "Kinzokusekken no Seishitsu to Oyo (Natures and Applications of Metal Soaps)" by Sachi Press; "Insatsu Ink Gijutsu (Printing Ink Technology)" by CMC Press, published in 1984; and "Saishin Ganryo Oyo Gijutsu (Modern Pigment Application Technology)" by CMC Press, published in 1986.

A pigment particle diameter of 0.01 $\mu$m to 10 $\mu$m is preferable, 0.05 $\mu$m to 1 $\mu$m is more preferable, and 0.1 $\mu$m to 1 $\mu$m is the most preferable. A pigment particle diameter smaller than 0.01 $\mu$m is not preferable in terms of the stability of the pigment dispersion in a photosensitive layer coating solution. On the other hand, a pigment particle diameter larger than 10 $\mu$m is not preferable in terms of the uniformity of the photosensitive layer.

Known dispersing methods employed in ink production or toner production can be used as methods of dispersing the pigment. Examples of dispersing machine which may be used include ultrasonic dispersing machines, sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Modern Pigment Application Technology)" by CMC Press, published in 1986.

Known dyes commercially available or those disclosed in literature (such as "Senryo Binran (Dye Handbook)" edited by Yuki Gosei Kagaku Kyokai (Organic Synthetic Chemistry Association), published in 1970) can be used as the dye which can be used in the first and second aspects of the present invention. Specifically, examples include azo dyes, metal complex salt azo dyes, pyrazolone azo dyes, anthraquinone dyes, phthalocyanine dyes, carbonium dyes, quinoneimine dyes, methyne dyes, cyanine dyes and the like.

In the present invention, among these pigments or dyes, those that absorb infrared or near-infrared light are particularly preferable since they are suitable for use with lasers which emit infrared or near-infrared light.

As the pigment that absorbs infrared or near-infrared light, carbon black is suitably used. Examples of these pigments that absorb infrared or near-infrared light include cyanine dyes disclosed in JP-A Nos. 58-125246, 59-84356, 59-202829, and 60-78787; methyne dyes disclosed in JP-A Nos. 58-173696, 58-181690, and 58-194595; naphthoquinone dyes disclosed in JP-A Nos. 58-112793, 58-224793, 59-48187, 59-73996, 60-52940, and 60-63744; squalilium dyes disclosed in JP-A No. 58-112792; cyanine dyes disclosed in U.K. Patent No. 434,875; dihydroperimidinesqualilium dyes described in U.S. Pat. No. 5,380,635; and the like.

Furthermore, near-infrared absorption sensitizing agents disclosed in U.S. Pat. No. 5,156,938 can be preferably used as this dye. Moreover, substituted aryl benzo(thio)pyrylium salts disclosed in U.S. Pat. No. 3,881,924; trimethyne thiapyrylium salts disclosed in JP-A No. 57-142645 (U.S. Pat. No. 4,327,169); pyrylium-containing compounds disclosed in JP-A Nos. 58-181051, 58-220143, 59-41363, 59-84248, 59-84249, 59-146063, and 59-146061; cyanine dyes disclosed in JP-A No. 59-216146; pentamethyne thiopyrylium salts disclosed in U.S. Pat. No. 4,283,475; pyrylium compounds disclosed in Japanese Patent Application Publication (JP-B) Nos. 5-13514 and 5-19702; and Epolight III-178, Epolight III-130, Epolight III-125, Epolight IV-62A and the like can be preferably used as well.

Near-infrared absorption dyes represented by formulas (I) and (II) disclosed in U.S. Pat. No. 4,756,993 can be listed as other examples of preferable dyes.

These dyes or pigments can be added in a printing plate material in an amount of 0.01 to 50% by weight based on the total weight of the solid components in the printing plate material, preferably in an amount of 0.1 to 10% by weight, more preferably in an amount of 0.5 to 10% by weight in the case of a dye, and more preferably in an amount of 3.1 to 10% by weight in the case of a pigment. An added amount of a pigment or dye of less than 0.01% by weight causes low sensitivity. On the other hand, an amount of more than 50% by weight reduces uniformity of a photosensitive layer and durability of the photosensitive layer deteriorates.

These dyes or pigments may be added to the same layer as other components, or another layer may be provided and the dyes or pigments added to this other layer. When another layer is provided, it is desirable that the dyes or pigments are added to a layer adjacent to a layer of the present invention containing a substance which can be decomposed and which substantially reduces the solubility of the binder when in a non-decomposable state. Though it is preferable that the dyes or pigments and the binding resin are contained in the same layer, they may be contained in separate layers.

Other Components

Various other additives can be added as needed to the positive type photosensitive composition of the present invention. For example, in order to improve the ability to inhibit dissolution of image portions into a developing solution, it is preferable to use in addition a substance which can be decomposed and which, when in a non-decomposable state, substantially reduces the solubility of the aqueous alkaline solution-soluble polymer compound. Example thereof include an onium salt, aromatic sulfone compound, aromatic sulfonate ester compound and the like.

As the onium salt, a diazonium salt, an ammonium salt, a phosphonium salt, an iodonium salt, a sulfonium salt, a selenonium salt, an arsonium salt and the like can be listed as examples.

As the onium salt used in the present invention, suitable examples thereof include the following: diazonium salts described in S. I. Schlesinger, Photogr. Sci. Eng., 18, 387 (1974), T. S. Bal et al, Polymer, 21, 423(1980), and JP-A 5-158,230; ammonium salts described in U.S. Pat. Nos. 4,069,055 and 4,069,056, and JP-A No. 3-140,140; phosphonium salts described in D. C. Necker et al, Macromolecules, 17, 2468(1984), C. S. Wen et al, Teh, Proc. Conf. Rad. Curing ASIA, p478 Tokyo, Oct. (1988), and U.S. Pat. Nos. 4,069,055 and 4,069,056; iodonium salts described in J. V. Crivello et al, Macromolecules, 10(6), 1307(1977), Chem. & Eng. News, Nov. 28, p31(1988), EP No. 104,143, U.S. Pat. Nos. 339,049and 410,210, JP-A Nos. 2-150,848 and 2-296,514; sulfonium salts described in J. V. Crivello et al, Polymer J. 17, 73(1985), J. V. Crivello et al. J. Org. Chem., 43, 3055(1978), W. R. Watt et al, J. Polymer Sci., Polymer Chem. Ed., 22, 1789(1984), J. V. Crivello et al, Polymer Bull., 14, 279(1985), J. V. Crivello et al, Macromolecules, 14(5), 1141(1981), J. V. Crivello et al, J. Polymer Sci., Polymer Chem. Ed., 17, 2877(1979), EP Nos. 370,693, 233,567, 297,443 and 297,442, U.S. Pat. Nos. 4,933,377, 3,902,114, 410,201, 339,049, 4,760,013, 4,734, 444 and 2,833,827, German Patent Nos. 2,904,626, 3,604, 580 and 3,604,581; selenonium salts described in J. V. Crivello et al, Macromolecules, 10(6), 1307(1977), J. V. Crivello et al, J. Polymer Sci., Polymer Chem. Ed., 17, 1047(1979); arsonium salts described in C. S. Wen et al, Teh, Proc. Conf. Rad. Curing ASIS, p478 Tokyo, Oct. (1988), and the like.

Examples of counter ions of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4, 6-trimethylbenzenesulfonic acid, 2-nitrobenzenesulfonic acid, 3-chlorobenzenesulfonic acid, 3-bromobenzenesulfonic acid, 2-fluorocaprilnaphthalenesulfonic acid, dodecylbenzenesulfonic acid, 1-naphthol-5-sulfonic acid, 2-methoxy-4-hydroxy-5-benzoyl-benzenesulfonic acid and p-toluenesulfonic acid and the like. Among these, hexafluorophosphoric acid, triisopropylnaphthalenesulfonic acid, and alkylaromatic sulfonic acids such as 2,5-dimethylbenzenesulfonic acid are particularly suitable.

The amount added of the onium salt additive is preferably from 1 to 50% by weight, more preferably from 5 to 30% by weight, particularly preferably from 10 to 30% by weight.

In the present invention, it is preferable that the additive and the binder are contained in the same layer.

For the purpose of further improving sensitivity, cyclic acid anhydrides, phenols and organic acids may also be used. As the cyclic acid anhydrides, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, $\alpha$-phenylmaleic anhydride, succinic anhydride, pyromellitic anhydride and the like described in U.S. Pat. No. 4,115,128 can be used. Examples of the phenols include bisphenol A, p-nitrophenol, p-ethoxyphenol, 2,4, 4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3', 5'-tetramethyltriphenylmethane and the like. Further, as the organic acids, there are sulfonic acids, sulfinic acids, alkylsulfuric acids, phosphonic acids, phosphoric esters and carboxylic acids described in JP-A Nos. 60-88942 and 2-96755 and the like, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthallic acid, terephthalic acid, 4-cyclohexene-1,2-dicarboxylic acid, erucic acid, lauric acid, n-undecanoid acid, ascorbic acid and the like.

The proportion of the above-described cyclic acid anhydrides, phenols and organic acids in a printing plate material is preferably from 0.05 to 20% by weight, more preferably from 0.1 to 15% by weight, and particularly preferably from 0.1 to 10% by weight.

In order to enable stable treatment regardless of fluctuations in development conditions, nonionic surfactants such as those disclosed in JP-A Nos. 62-251740 and 3-208514 and ampholytic surfactants such as those disclosed in JP-A Nos. 59-121044 and 4-13149 can be added to the printing plate material of the present invention.

Specific examples of nonionic surfactants include sorbitan tristearate, sorbitan monopalmitate, sorbitan triolate, mono glyceride stearate, and polyoxyethylene nonylphenyl ether, and the like.

Specific examples of ampholytic surfactants include alkyl di(aminoethyl)glycine, alkyl polyaminoethylglycine hydrochloride, 2-alkyl-N-carboxyethyl-N-hydroxyethyl imidazolinium betaine, and N-tetradecyl-N,N-substituted betaine (for example, Amorgen K manufactured by Dai-Ichi Kogyo Co., Ltd.), and the like.

The amount of the above-mentioned nonionic surfactants and ampholitic surfactants is preferably from 0.05 to 15% by weight, and more preferably from 0.1 to 5% by weight in the printing plate material.

A dye or pigment as an image coloring agent, and a printing-out agent for obtaining a visible image directly after heating by exposure can be added to a printing plate material in the present invention.

As the printing-out agent, a combination of a compound which releases an acid due to heating by exposure (light acid releasing agent), with an organic dye which can form a salt, can be listed as a typical example. Specifically, there can be listed as examples a combination of o-naphthoquinonediazide-4-sulfonic acid halogenide with a salt-forming organic dye described in JP-A Nos. 50-36209 and 53-8128, and a combination of a trihalomethyl compound with a salt-forming organic dye described in JP-A Nos. 53-36223, 54-74728, 60-3626, 61-143748, 61-151644 and 63-58440. As the trihalomethyl compound, there are an oxazole-based compound and a triazine-based compound, and either compound has excellent stability over time and imparts a clear baked image.

As the coloring agent of an image, other dyes can be used in addition to the above-described salt-forming organic dyes. Oil-soluble dyes and salt-forming dyes can be listed as suitable dyes including the salt-forming organic dyes. Specifically, examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (all of the above manufactured by Orient Chemical Industry, Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015) and the like. Dyes disclosed in JP-A No. 62-293247 are particularly preferable. These dyes can be added to a printing plate material in a proportion from 0.01 to 10% by weight, preferably from 0.1 to 3% by weight based on the total weight of the solid components in the printing plate material.

In order to provide the film with flexibility and the like, if necessary, a plasticizer can be added to the printing plate material of the present invention. Examples of the plasticizer include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, and the like.

In the image forming material of the present invention, a cross-linking agent such as a phenol compound having an alkoxymethyl group, an acyloxymethyl group or hydroxymethyl group described in D. H. SOLOMON, "THE CHEMISTRY OF ORGANIC FILM FORMERS", JP-B No. 1-49932, and JP-A Nos. 7-53426 and 7-61946, and the like can be added to the image forming material in order to obtain a printing plate having an even better run length by conducting burning treatment after development with exposure.

These cross-linking agents may be used alone or in combinations of two or more, and the amount thereof is from 0.2 to 60% by weight, preferably from 0.5 to 20% by weight based on a photosensitive composition.

The image recording material of the present invention can be produced, in general, by dissolving the above-described components in a solvent and applying the resultant solution to an appropriate supporting substrate. Examples of solvents used herein include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrrolidone, dimethyl sulfoxide, sulfolane, γ-butyrolactone, toluene, and the like. These solvents may be used alone, or a combination thereof. The concentration of the above-described components (the total solid component including the additives) is preferably from 1 to 50% by weight in the solution. The amount to be applied (solid component) on the supporting substrate depends on the purpose for which the image forming material is to be used. However, when the image forming material is to be used for a planographic printing plate, in general, an amount which is 0.5 to 5.0 $g/m^2$ after coating and drying is preferable. As the method of application, any of various methods can be used, such as bar coater application, rotation application, spray application, curtain application, dip application, air knife application, blade application, roll application, and the like. The smaller the amount applied, the greater the apparent sensitivity, but the worse the coating property of the image recording film.

A surfactant for improving the applicability, such as a fluorine-containing surfactant disclosed in JP-A No. 62-170950 can be added to the photosensitive layer in the present invention. The added amount is preferably from 0.01 to 1% by weight, and more preferably from 0.05 to 0.5% by weight based on the total weight of printing plate materials in the printing plate material.

A supporting substrate used in the present invention may be a dimensionally stable plate-shaped substance. Examples thereof include paper, paper laminated with plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film on which any of the above-listed metals is laminated or deposited.

A polyester film or an aluminum plate is preferable as the supporting substrate in the present invention. An aluminum plate is particularly preferable since it has good dimensional stability and can be provided at a relatively low cost. Examples of preferable aluminum plates include pure aluminum plates and alloy plates comprising aluminum as the main component and trace qualities of a different element. Furthermore, plastic films on which aluminum is laminated or deposited can also be used. Examples of different elements included in the aluminum alloy include silicon, iron, manganese, copper, magnesium, chromium, zinc, bismuth, nickel, and titanium. The amount of the different element in the alloy is preferably 10% by weight or less. In the present invention, pure aluminum is particularly preferable. However, since production of a completely pure aluminum is difficult in terms of refining technology, an aluminum containing a slight amount of a different element can be used. The composition of an aluminum plate applied to the present invention is not specifically defined, and a known aluminum plate can also be used. The thickness of the aluminum plate used in the present invention is from about 0.1 mm to 0.6 mm, preferably from 0.15 mm to 0.4 mm, and more preferably from 0.2 mm to 0.3 mm.

It is preferable to conduct roughening treatment previously in cases in which an aluminum plate is used as the supporting substrate. In this case, prior to roughening the surface of the aluminum plate, a degreasing treatment with, for example, a surfactant, an organic solvent, an aqueous alkaline solution, or the like may be conducted to remove the rolling oil on the surface, if desired.

The surface roughening treatment of the aluminum plate can be carried out by using any of various methods, such as, for example, a mechanically roughening method, an electrochemically roughening method in which the plate surface is dissolved, and a chemically roughening method in which a plate surface is dissolved selectively. The mechanical method may be a known method such as a ball abrasion method, brush abrasion method, blast abrasion method, or buff abrasion method. The electrochemically roughening method may be a method in which an alternating current or direct current is applied to the plate in an electrolytic solution containing hydrochloric acid or nitric acid. Further, a method combining both of the above-mentioned methods as disclosed in JP-A No. 54-63902 can be used.

An aluminum plate which has undergone surface roughening treatment may be subjected to an alkaline etching treatment or a neutralizing treatment if necessary, followed by an anodizing treatment so as to improve the water retention property and the abrasion resistance property of the surface if desired. As the electrolyte used in the anodizing treatment of the aluminum plate, any of various electrolytes which form a porous oxide film can be used. In general, sulfuric acid, phosphoric acid, oxalic acid, chromic acid, or a mixture thereof can be used. The concentration of the electrolyte solution depends on the type of electrolyte solution.

The conditions of the anodizing treatment cannot be determined as a general rule since they change in many ways depending on the electrolyte solution used. However, in general, it is appropriate that the concentration of the electrolyte solution is from 1 to 80% by weight, the temperature of the electrolyte solution is from 5 to 70° C., the current density is from 5 to 60 $A/dm^2$, the voltage is from 1 to 100 V, and the electrolysis time is from 10 seconds to 5 minutes.

An amount of anodized film less than 1.0 $g/m^2$ results in insufficient run length of the planographic printing plate, and scratches are easily produced in non-image portions of the planographic printing plate. Thus, it is easy for so-called "scratch toning", which occurs due to ink adhering to the scratches during printing, to occur.

After the anodizing treatment, the aluminum surface is subjected to a hydrophilic treatment if necessary. Examples of a hydrophilic treatment used in the present invention include an alkaline metal silicate (such as an aqueous solution of sodium silicate) method as disclosed in U.S. Pat. Nos. 2,714,066, 3,181,461, 3,280,734 and 3,902,734. In this method, the supporting substrate is treated by immersion or electrolysis in an aqueous solution of sodium silicate. Other examples include a method of treating with potassium fluorozirconate disclosed in JP-B No. 36-22063 and a method of treating with polyvinyl phosphonate disclosed in U.S. Pat. Nos. 3,276,868, 4,153,461 and 4,689,272.

The image recording material of the present invention is formed by providing a positive type printing plate material on a supporting substrate, and a primer layer may be optionally formed between them.

The component of the primer layer may be any of various organic compounds, and may be selected from phosphonic acids having an amino group, such as, carboxy methylcellulose; dextrin; gum arabic, 2-amino ethyl phosphonic acid; organic phosphonic acid, such as, phenyl phosphonic acid, naphthyl phosphonic acid, alkyl phosphonic acid, glycero phosphonic acid, methylene diphosphonic acid and ethylene diphosphonic acid; organic phosphoric acid, which may be substituted, such as phenyl phosphotic acid, naphthyl phosphoric acid, alkyl phosphoric acid and glycero phosphoric acid; organic phosphinic acids, which may be substituted, such as phenyl phosphinic acid, naphthyl phosphinic acid, alkyl phosphinic acid, and glycero phosphinic acid; amino acids such as glycine and β-alanine; and hydrochlorides of amine having a hydroxy group, such as hydrochloride of triethanol amine. These compounds may be used in a mixture of two or more.

This organic primer layer can be made by the following method. Namely, there are: a method in which a solution prepared by dissolving the above-described organic compound in water, in an organic solvent such as methanol, ethanol, methyl ethyl ketone and the like, or in a mixture thereof is applied to an aluminum plate, and dried to form a primer layer; and a method in which an aluminum plate is immersed into a solution prepared by dissolving the above-described organic compound in water, in an organic solvent such as methanol, ethanol, methyl ethyl ketone and the like, or in a mixture thereof, the above-described compound is adsorbed, and thereafter, the aluminum plate is washed with water or the like and dried to form a primer layer. In the former method, the solution, which contains the above-described organic compound in a concentration from 0.005 to 10% by weight, can be applied by various methods. In the latter method, the concentration of the solution is from 0.01 to 20% by weight, preferably from 0.05 to 5% by weight, the immersion temperature is from 20 to 90° C., preferably from 25 to 50° C., and the immersion time is from 0.1 seconds to 20 minutes, preferably from 2 seconds to 1 minute. The pH value of the solution used in this method can be kept in a range from 1 to 12 by using a basic substance such as ammonia, triethylamine, potassium hydroxide and the like, or an acidic substance such as hydrochloric acid, phosphoric acid and the like. Further, a yellow dye can also be added for improving tone reproducibility of the image recording material.

The amount of the organic primer layer coated is suitably from 2 to 200 $mg/m^2$, preferably from 5 to 100 $mg/M^2$. When the amount coated is less than 2 $mg/m^2$, a printing plate having sufficient run length is not obtained. When the amount coated is over 200 $mg/m^2$, the same tendency is observed.

The positive type image recording material thus produced is usually subjected to imagewise exposure and a developing treatment.

As a light source used for the imagewise exposure, there are, for example, a mercury lamp, metal halide lamp, xenon lamp, chemical lamp, carbon arc lamp and the like. As a radiation beam, there are an electron beam, X-ray, ion beam, far infrared ray and the like. Also, a g-ray, i-ray, Deep-UV light, high concentrated energy beam (laser beam) are used. As the laser beam, a helium/neon laser, argon laser, krypton laser, helium/cadmium laser, KrF excimer laser, solid laser, semiconductor laser and the like are listed as examples.

In the present invention, a light source having an illuminating wave length in a range from near-infrared to far infrared is preferable, and a solid laser and a semiconductor laser are particularly preferable.

A conventionally known aqueous alkaline solution can be used as a developing solution or a replenishing solution for the image recording material of the present invention. Examples thereof include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Furthermore, also used are organic alkaline agents such a monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkaline agents can be used alone or in combinations of two or more.

Particularly preferable developing solutions among these alkaline agents are an aqueous solution of silicate, such as sodium silicate, potassium silicate, or the like, since the developing property can be adjusted by the ratio and concentration of the silicon dioxide $SiO_2$ to the alkaline metal oxide $M_2O$, which are components of the silicate. For example, alkaline metal silicates such as those disclosed in JP-A No. 54-62004 and JP-B No. 57-7427 can be used efficiently.

Furthermore, it is known that, in a case in which an automatic developing machine is used for developing, by adding to the developing solution an aqueous solution (replenishing solution) whose alkaline strength is greater than that of the developing solution, a large amount of planographic printing plates can be developed without changing the developing solution in the developing tank for a long period of time. The replenishing method is also preferably applied in the present invention. Various types of surfactants and organic solvents can be added to the developing solution or the replenishing solution to promote or restrain the developing property, to improve the dispersion of developing scum or the conformity of the printing plate image portion to ink, if necessary. Examples of preferable surfactants include anionic surfactants, cationic surfactants, nonionic surfactants, and ampholytic surfactants.

Furthermore, reducing agents such as a sodium salt or a potassium salt of an inorganic acid such as hydroquinone, resorcin, sulfurous acid, and hydrogen sulfurous acid can be added to the developing solution or the replenishing solution, if necessary. Further, organic carboxylic acid, antifoaming agents, and water softeners can be added to the developing solution or the replenishing solution, if necessary.

Printing plates developed with the above-mentioned developing solutions and replenishing solutions are subjected to an after-treatment with a rinsing solution containing water, a surfactant and the like, and with a desensitizing solution containing gum arabic, a starch derivative and the like. These treatments can be used in any of various combinations as the after-treatment when the image recording material of the present invention is used as a printing plate.

Recently, an automatic developing machine for printing plates has been widely used in plate making and printing industries in order to streamline and standardize the plate making operation. In general, this automatic developing machine comprises a developing means and an after-treatment means. Each means comprises a device for conveying a printing plate, treatment solution tanks, and spraying devices. Developing processing is carried out by spraying treatment solutions, which are pumped up by pumps, from spray nozzles to the printing plate after exposure, while the printing plate is being conveyed horizontally. In addition, a processing method has also become known recently in which, after exposure, a printing plate is immersed in treatment solution tanks filled with treatment solutions while the printing plate is being conveyed through the solutions by guide rollers. In such automatic processing, while processing is being carried out, replenishing solutions can be replenished into the respective treatment solutions in accordance with the processed amount of the printing plate, the work time, or the like.

Further, what is called a disposable treating method in which treatment is conducted using substantially unused treating solution can also be applied.

The case in which the image recording material of the present invention is used as a photosensitive planopraphic printing plate will be described hereinafter. When a planographic printing plate obtained by imagewise exposure, development, water washing and/or rinsing and/or gum coating has unnecessary image portions (for example, film edge traces of an original image film, or the like), the unnecessary image portions are deleted. Such deletion is preferably conducted by a method in which a deletion solution such as those described in JP-B No. 2-13,293 is applied on the unnecessary image portions, allowed to stand for a given amount of time, and thereafter, washed with water. There can be also used a method in which the unnecessary image portions are irradiated with an active beam that is guided by an optical fiber such as those described in JP-A No. 59-174842.

A planographic printing plate obtained as described above can be used in a printing process, after applying a desensitizing gum if desired. However, in a case in which a planographic printing plate having a better run length is desired, a burning treatment is used.

If the planographic printing plate is subjected to a burning treatment, it is preferable to treat the plate with a baking conditioner such as those disclosed in JP-B Nos. 61-2518 and 55-28062, and JP-A Nos. 62-31859 and 61-159655, prior to burning.

Methods of treating the plate with a baking conditioner include a method of applying the baking conditioner on a planographic printing plate with a sponge or an absorbent cotton infused with the baking conditioner, a method of applying the baking conditioner to a printing plate by immersing the plate in a tray filled with the solution, and a method of applying the baking conditioner to the plate with an automatic coater. By making the applied amount of the solution uniform with a squeegee or a squeegee roller after application, a more preferable result can be obtained.

An appropriate amount of a baking conditioner to be applied is 0.03 to 0.8 $g/m^2$ (dry weight), in general.

The planographic printing plate, to which the baking conditioner has been applied and then dried, is heated at a high temperature with a burning processor (such as a burning processor BP-1300 commercially available from Fuji Photo Film Co., Ltd.), if necessary. The heating temperature and the duration of heating depend on the types of components forming the image. However, a range from 180 to 300° C. and a range from 1 to 20 minutes are preferable.

A planographic printing plate treated with the burning treatment can be subjected to conventional treatments such as a water washing treatment, a gum coating treatment, and the like, if necessary. However, in a case in which a baking conditioner containing a water-soluble polymer compound is used, a desensitizing treatment such as gum coating can be omitted.

A planographic printing plate obtained by such treatment is used in an offset printer for printing large quantities.

EXAMPLES

Hereinafter, the present invention will be illustrated in further detail with reference to examples, However, the present invention is not limited thereto.

Example I-1

Production of Supporting Substrate

An aluminum plate (material 1050) having a thickness of 0.30 mm was degreased by washing with trichloroethylene. A roughening treatment was carried out on the aluminum plate by graining the surface with a nylon brush and an aqueous suspension of 400 mesh pumice stone powder, and the plate was then washed with water. The plate was etched by being immersed for 9 seconds in a 20% aqueous solution of sodium hydroxide of 45° C., and was then washed with water. Thereafter, the plate was further immersed in 20% nitric acid for 20 seconds and then washed with water. The etching amount of the grained surface was about 3 $g/m^2$. Then, the plate was provided with a direct current anodic oxidization film of 3 $g/m^2$by using 7% sulfuric acid as the electrolyte and a current density of 15 $A/dm^2$. The plate was then washed with water and dried. Then, the following primer solution was applied to the aluminum plate, and the plate was dried at 90° C. for 1 minute. After drying, the coated amount was 10 $mg/M^2$.

Composition of Primer Solution

| | |
|---|---|
| β-Alanine | 0.5 g |
| Methanol | 95 g |
| Water | 5 g |

A photosensitive solution I-1 described below was applied on the resulted supporting substrate so that the amount applied was 1.8 g/$m^2$, and a planographic printing plate was obtained.

Composition of Photosensitive Solution I-1

| | |
|---|---|
| • m,p-cresol novolak*1 (m/p ratio = 6/4, weight-average molecular weight 3500, containing 0.5% by weight of unreacted cresol) | 1.0 g |
| N,N,N',N'-tetrakis(p-di-n-butylaminophenyl)-p-benzoquinonebis (ammonium · hexafluoroantimonate)*2 | 0.2 g |
| • Dye obtained by replacing the counter anion in Victoria Pure Blue with 1-naphthalenesulfonate anion | 0.02 g |
| • Fluorine-based surfactant (MEGAFAC F-177, manufactured by Dainippon Ink & Chemicals Inc. Co., Ltd.) | 0.05 g |
| • γ-Butyrolactone | 3.0 g |
| • Methyl ethyl ketone | 8.0 g |
| • 1-Methoxy-2-propanol | 7.0 g |

*1: aqueous alkaline solution-soluble polymer compound
*2: compound represented by the general formula I-(2)

Example I-2

Synthesis of Specific Copolymer as Aqueous Alkaline Solution-soluble Polymer Compound Synthesis Example (Copolymer 1)

Into a 500 ml three-necked flask equipped with a stirrer, a cooling tube and a dropping funnel were charged 31.0 g (0.36 mol) of methacrylic acid, 39.1 g (0.36 mol) of ethyl chloroacetate and 200 ml of acetonitrile, and the mixture was stirred while being cooled with an ice water bath. To this mixture were added dropwise 36.4 g (0.36 mol) of triethylamine over about 1 hour. After completion of this addition, the ice water bath was removed, and the mixture was stirred at room temperature for 30 minutes.

To this reaction mixture were added 51.7 g (0.30 mol) of p-aminobenzenesulfonamide, and the mixture was stirred for 1 hour while being heated at 70° C. with an oil bath. After completion of a reaction, this mixture was added into one liter of water while stirring the water, and the resulted mixture was stirred for 30 minutes. This mixture was filtered to remove a precipitate, the result was made into slurry with 500 ml of water, and thereafter, this slurry was filtered. The resulting solid was dried to obtain a white solid of N-(p-aminosulfonylphenyl)methacrylamide (yield 46.9 g).

Then, into a 100 ml three-necked flask equipped with a stirrer, a condenser and a dropping funnel were charged 5.04 g (0.0210 mol) of N-(p-aminosulfonylphenyl) methacrylamide, 2.05 g (0.0180 mol) of ethyl methacrylate, 1.11 g (0.021 mol) of acrylonitrile and 20 g of N,N-dimethylacetoamide, and this mixture was stirred while being heated at 65° C. with a hot water bath. To this mixture were added 0.15 g of "V-65" (manufactured by Wako Pure Chemical Co., Ltd.) and this mixture was stirred for 2 hours under a nitrogen flow while keeping the temperature at 65° C. To this reaction mixture were further added dropwise over 2 hours, using a dropping funnel, a mixture of 5.04 g of N-(p-aminosulfonylphenyl)methacrylamide, 2.05 g of ethyl methacrylate, 1.11 g of acrylonitrile, 20 g of N,N-dimethylacetoamide and 0.15 g of "V-65". Further, after completion of dropping, the mixture was stirred for 2 hours at 65° C. After completion of the reaction, 40 g of methanol were added to the mixture, which was then cooled, and the resulting mixture was added into two liters of water while the water was stirred. The resulting mixture was stirred for 30 minutes, and thereafter, the mixture was filtered to remove a precipitate, and then was dried to obtain 15 g of a white solid. This copolymer 1 was measured by gel permeation chromatography and the weight average molecular weight (polystyrene standard) was found to be 53,000.

A photosensitive solution I-2 described below was applied on the same kind of supporting substrate as the supporting substrate obtained in Example I-1 such that the amount applied was 1.8 g/$m^2$, to obtain a planographic printing plate.

Composition of Photosensitive Solution I-2

| | |
|---|---|
| • Above-described copolymer 1 | 1.0 g |
| N,N,N',N'-tetrakis(p-di-n-butylaminophenyl)-p-benzoquinonebis (ammonium · hexafluoroantimonate)*3 | 0.1 g |
| • p-Toluenesulfonic acid | 0.002 g |
| • Dye obtained by replacing the counter anion in Victoria Pure Blue BOH with 1-naphthalenesulfonate anion | 0.02 g |
| • Fluorine-based surfactant (MEGAFAC F-177, manufactured by Dainippon Ink & Chemicals Inc. Co., Ltd.) | 0.05 g |
| • γ-Butyrolactone | 8.0 g |
| • Methyl ethyl ketone | 8.0 g |
| • 1-Methoxy-2-propanol | 4.0 g |

*3: compound represented by the general formula I-(2)

Comparative Example I-1

A planographic printing plate was produced in the same manner as in Example I-1 except that the compound represented by the general formula I-(1) which was blended in the photosensitive solution I-1 was changed to a carbon black dispersed solution having the following composition in Example I-1.

Composition of Carbon Black Dispersion

| | |
|---|---|
| • Carbon black | 1 part by weight |
| • Copolymer of benzyl methacrylate with methacrylic acid (molar ratio 72:28, average molecular weight 70,000) | 1.6 parts by weight |
| • Cyclohexanone | 1.6 parts by weight |
| • Methoxypropyl acetate | 3.8 parts by weight |

Evaluation of Ability of Planographic Printing Plate

The planographic printing plates of Examples I-1 to I-2 and Comparative Example I-1 produced as described above were subjected to ability evaluations based on the following standard. The evaluation results are shown in Table 1.

Evaluation of Sensitivity and Developing Latitude

Each of these resulting planographic printing plates was irradiated using a YAG laser at an output of 700 mW, a wavelength of 1064 nm and a beam diameter of 45 μm (1/$e^2$), at a main scanning speed of 5 m/second, and thereafter development was conducted using an automated developing machine (manufactured by Fuji Photo Film Co., Ltd.: PS Processor 900VR), a developing solution DP-4 and a rinsing solution FR-3 (1:7) manufactured by Fuji Photo Film Co., Ltd having been charged thereinto. Then, two standards were used wherein DP-4 was diluted at 1:8 and 1:12, and the line width of non-image portions obtained when using each of the developing solutions, respectively, was measured, and the irradiation energy of a laser corresponding to this line width was calculated, and this was recognized as the sensitivity. And the difference between the sensitivities when the dilution ratio was 1:8 and 1:12, respectively, was recorded. The lower this difference, the more excellent the developing latitude, and when the difference was 20 $mJ/cm^2$ or less, it was at a practical level.

TABLE 1

| | Sensitivity ($mJ/cm^2$) | | |
|---|---|---|---|
| | DP-4 (1:8) | DP-4 (1:12) | Developing latitude (1:8)–(1:12) |
| Example I-1 | 130 | 135 | 5 |
| Example I-2 | 140 | 150 | 10 |
| Comparative Example I-1 | 150 | 200 | 50 |

Table 1 shows that the planographic printing plate of the present invention is excellent in developing latitude in comparison with the plate in Comparative Example I-1.

Example II-1

Production of Supporting Substrate

A supporting substrate was produced in the same manner as in Example I-1.

A photosensitive solution II-1 described below was applied on the obtained substrate so that the amount applied was 1.8 $g/m^2$, to obtain a planographic printing plate.

Composition of Photosensitive Solution II-1

| | |
|---|---|
| • m,p-cresol novolak*4 (m/p ratio = 6/4, weight-average molecular weight 3500, containing 0.5% by weight of unreacted cresol) | 1.0 g |
| • Compound of the general formula II-[1]-77 ($R_1$ to $R_6$: $C_2H_5$, $R_7$ to $R_9$: H, X: $SbF_6$) | 0.2 g |
| • Dye obtained by replacing the counter anion in Victoria Pure Blue BOH with 1-naphthalenesulfonate anion | 0.02 g |
| • Fluorine-based surfactant (MEGAFAC F-177, manufactured by Dainippon Ink & Chemicals Inc.) | 0.05 g |
| • γ-Butyrolactone | 3.0 g |
| • Methyl ethyl ketone | 8.0 g |
| • 1-Methoxy-2-propanol | 7.0 g |

*4: aqueous alkaline solution-soluble polymer compound

Example II-2

Synthesis of Specific Copolymer as Aqueous Alkaline Solution-soluble Polymer Compound A copolymer was produced in the same manner as in Example I-2. A photosensitive solution II-2 described below was applied on a supporting substrate of the same kind as that obtained in Example I-1, so that the amount applied was 1.8 $g/m^2$ to obtain a planographic printing plate was obtained.

Composition of Photosensitive Solution II-2

| | |
|---|---|
| • Above-described copolymer 1 | 1.0 g |
| • Compound of the general formula II-[2]-33 ($R_1$ to $R_6$: $C_2H_5$, $R_7$ to $R_9$: H, X: $SbF_6$) | 0.1 g |
| • p-Toluenesulfonic acid | 0.002 g |
| • Dye obtained by replacing the counter anion in Victoria Pure Blue BOH with 1-naphthalenesulfonate anion | 0.02 g |
| • Fluorine-based surfactant (MEGAFAC F-177, manufactured by Dainippon Ink & Chemicals Inc.) | 0.05 g |
| • γ-Butyrolactone | 8.0 g |
| • Methyl ethyl ketone | 8.0 g |
| • 1-Methoxy-2-propanol | 4.0 g |

Example II-3

An experiment was conducted in the same manner as in Example II-1 except that the compound represented by the general formula II-[2]-85 ($R_1$ to $R_6$: $C_2H_5$, $R_7$ to $R_9$: H, X: $ClO_4$) was used as the compound of the present invention.

Example II-4

An experiment was conducted in the same manner as in Example II-1 except that the compound represented by the general formula II-[2]-43 ($R_1$ to $R_6$: $CH_2CF_3$, $R_7$ to $R_9$: H, X: $SbF_6$) was used as the compound of the present invention.

Comparative Example II-1

A planographic printing plate was obtained in the same manner as in Example II-1 except that the compound represented by the general formula II-[1] which was blended in the photosensitive solution II-1 was changed to a carbon black dispersion having the following composition.

Composition of Carbon Black Dispersion

| | |
|---|---|
| • Carbon black | 1 part by weight |
| • Copolymer of benzyl methacrylate with methacrylic acid (molar ratio 72:28, average molecular weight 70,000) | 1.6 parts by weight |
| • Cyclohexanone | 1.6 parts by weight |
| • Methoxypropyl acetate | 3.8 parts by weight |

Evaluation of Ability of Planographic Printing Plate

The planographic printing plates of Examples II-1 to II-4 and Comparative Example II-1 produced as described above were subjected to ability evaluations based on the following standard. The evaluation results are shown in Table 2.

Evaluation of Sensitivity and Developing Latitude

Evaluations of sensitivity and developing latitude were conducted in the same manner as in Examples I-1 and I-2 and Comparative Example I-1.

TABLE 2

Table of sensitivity and developing latitude

| | Sensitivity ($mJ/cm^2$) | | |
|---|---|---|---|
| | DP-4 (1:8) | DP-4 (1:12) | Developing latitude (1:8)–(1:12) |
| Example II-1 | 140 | 150 | 10 |
| Example II-2 | 135 | 140 | 5 |

TABLE 2-continued

Table of sensitivity and developing latitude

| | Sensitivity (mJ/cm$^2$) | | |
|---|---|---|---|
| | DP-4 (1:8) | DP-4 (1:12) | Developing latitude (1:8)–(1:12) |
| Example II-3 | 135 | 145 | 10 |
| Example II-4 | 150 | 165 | 15 |
| Comparative Example II-1 | 150 | 200 | 50 |

Table 2 shows that the planographic printing plate of the present invention is excellent in terms of developing latitude in comparison with the plate in Comparative Example II-1.

What is claimed is:

1. A positive type photosensitive composition for infrared lasers comprising at least one aqueous alkaline solution-soluble polymer compound having at least one of the following functional groups (a-1) to (a-3):

(a-1) a phenolic hydroxyl group, (a-2) a sulfonamide group and (a-3) an active imide group and a compound represented by either of the following general formulae I-(1) and I-(2):

I-(1)

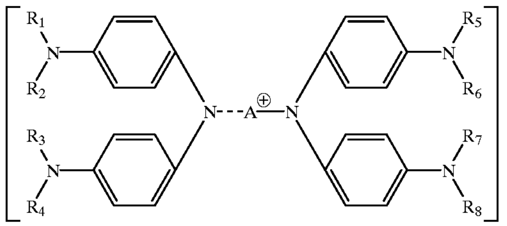

I-(2)

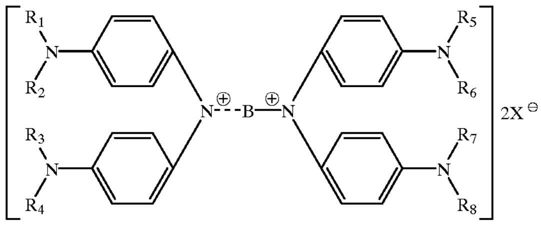

wherein, A represents

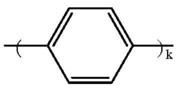

(wherein, k represents 1 or 2); B represents

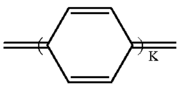

(wherein, k represents 1 or 2); and an aromatic ring may be substituted with a lower alkyl group, lower alkoxy group, halogen atom or hydroxyl group; $R_1$ to $R_8$ each independently represents a hydrogen atom, halogen atom, substituted or unsubstituted alkyl group, substituted or unsubstituted alkenyl group, substituted or unsubstituted aralkyl group, or substituted or unsubstituted alkynyl group; and $R_1$ and $R_2$, $R_3$ and $R_4$, $R_5$ and $R_6$, or $R_7$ and $R_8$, may form together with N a substituted or unsubstituted five-membered ring, substituted or unsubstituted six-membered ring, or substituted or unsubstituted seven-membered ring; and $X^-$ represents an anion.

2. The composition according to claim 1, wherein said aqueous alkaline solution-soluble polymer compound has the (a-1) phenolic hydroxyl group, and said polymer compound is selected from the group consisting of pyrogallol-acetone resins, and phenol-formaldehyde resins, m-cresol-formaldehyde resins, p-cresol-formaldehyde resins, m-/p-mixed-cresol-formaldehyde resins and phenol/cresol (may be m-, p-, or m-/p-mixed type) mixed formaldehyde resins.

3. The composition according to claim 1, wherein said aqueous alkaline solution-soluble polymer compound has the (a-1) phenolic hydroxyl group in a side chain.

4. The composition according to claim 3, wherein said polymer compound is obtained by homopolymerization of a polymerizable monomer having the phenolic hydroxyl group wherein the monomer is selected from the group consisting of acrylamide, methacrylamide, acrylate, methacrylate, and hydroxystyrene.

5. The composition according to claim 3, wherein said polymer compound is obtained by homopolymerization of a polymerizable monomer having the phenolic hydroxyl group wherein the monomer selected from the group consisting of N-(2-hydroxyphenyl)acrylamide, N-(3-hydroxyphenyl)acrylamide, N-(4-hydroxyphenyl) acrylamide, N-(2-hydroxyphenyl)methacrylamide, N-(3-hydroxyphenyl)methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, and 2-(4-hydroxyphenyl)ethyl methacrylate.

6. The composition according to claim 1, wherein said aqueous alkaline solution-soluble polymer compound has the (a-2) sulfonamide group, and said polymer compound is obtained by homopolymerization of a polymerizable monomer having a sulfonamide group or obtained by copolymerization of the polymerizable monomer with other polymerizable monomer(s).

7. The composition according to claim 6, wherein said polymerizable monomer having a sulfonamide group is composed of a compound with a low molecular weight having at least one sulfonamide group —NH—$SO_2$— wherein a molecule of the monomer has at least one hydrogen atom connected to a nitrogen atom and one or more polymerizable unsaturated bonds.

8. The composition according to claim 7, wherein said polymerizable monomer having a sulfonamide group is composed of a compound with a low molecular weight having an acryloyl, allyl or vinyloxy group, and a substituted sulfonylimino or substituted or mono-substituted aminosulfonyl group.

9. The composition according to claim 6, wherein said polymerizable monomer having a sulfonamide group is selected from compounds represented by the following general formulae (3) to (7):

(3)

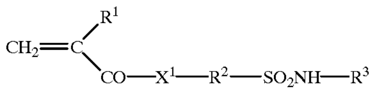

(4)

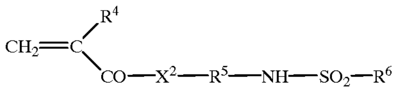

(5)

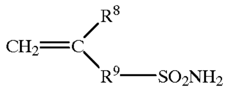

(6)

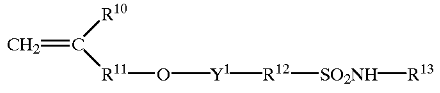

(7)

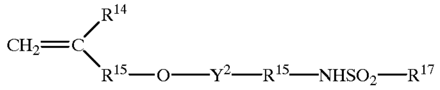

wherein $X^1$ and $X^2$ each independently represents —O— or —$NR^7$—; $R^1$ and $R^4$ each independently represents a hydrogen atom or —$CH_3$; $R^2$, $R^5$, $R^9$, $R^{12}$ and $R^{16}$ each independently represents an alkylene group, cycloalkylene group, arylene group or aralkylene group, wherein each group has 1 to 12 carbon atoms and may have a substituent; $R^3$, $R^7$ and $R^{13}$ each independently represents a hydrogen atom, alkyl group, cycloalkylene group, aryl group or aralkyl group, wherein each group has 1 to 12 carbon atoms and may have a substituent; $R^6$ and $R^{17}$ each independently represents an alkyl group, cycloalkylene group, aryl group or aralkyl group, wherein each group has 1 to 12 carbon atoms and may have a substituent; $R^8$, $R^{10}$ and $R^{14}$ each independently represents a hydrogen atom or —$CH_3$; $R^{11}$ and $R_{15}$ each independently represents a single bond, or an alkyl group, cycloalkylene group, arylene group or aralkylene group, wherein each group has 1 to 12 carbon atoms and may have a substituent; and $Y^1$ and $Y^2$ each independently represents a single bond or —CO—.

10. The composition according to claim 9, wherein said polymerizable monomer having a sulfonamide group is selected from the group consisting of m-aminosulfonylphenyl methacrylate, N-(p-aminosulfonylphenyl)methacrylamide, and N-(p-aminosulfonylphenyl)acrylamide.

11. The composition according to claim 6, wherein said aqueous alkaline solution-soluble polymer compound has the (a-3) active imide group, and said polymer compound is obtained by homopolymerization of a polymerizable monomer composed of a compound with a low molecular weight having therein at least one active imino group represented by the following formula and at least one polymerizable unsaturated bond, or obtained by copolymerization of the polymerizable monomer with other polymerizable monomer(s)

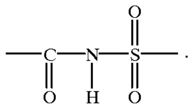

12. The composition according to claim 11, wherein said polymer compound is N-(p-toluenesulfonyl) methacrylamide or N-(p-toluenesulfonyl)acrylamide.

13. A positive type photosensitive composition for infrared lasers comprising at least one aqueous alkaline solution-soluble polymer compound having at least one of the following functional groups (a-1) to (a-3):

(a-1) a phenolic hydroxyl group, (a-2) a sulfonamide group and (a-3) an active imide group and a compound represented by either of the following general formulae II-[1] and II-[2]:

II-[1]

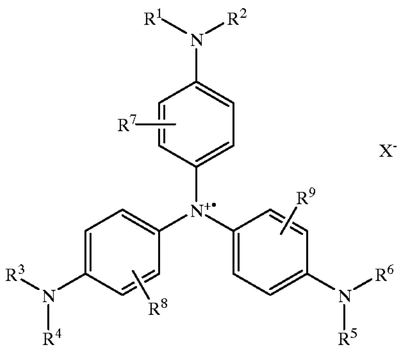

II-[2]

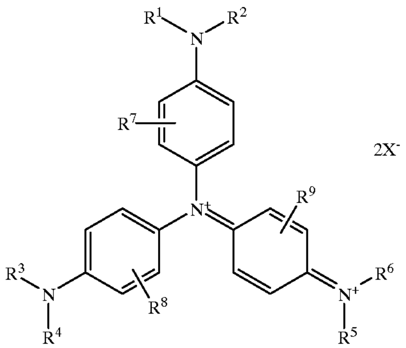

wherein, $R_1$ to $R_6$ each independently represents a hydrogen atom, substituted or unsubstituted alkyl group, substituted or unsubstituted alkenyl group, substituted or unsubstituted alkynyl group, substituted or unsubstituted cycloalkyl group, substituted or unsubstituted aryl group, substituted or unsubstituted aralkyl group or substituted or unsubstituted heterocyclic group; $R_1$ and $R_2$, $R_3$ and $R_4$, or $R_5$ and $R_6$, may form together with N a substituted or unsubstituted five-, six- or seven-membered ring; $R_7$ to $R_9$ each independently represents a hydrogen atom, halogen atom, substituted or unsubstituted alkyl group, substituted or unsubstituted alkoxy group, or a substituted or unsubstituted aryloxy group, cyano group or hydroxy group; and $X^-$ represents a monovalent anion.

14. The composition according to claim 13, wherein said aqueous alkaline solution-soluble polymer compound has the (a-1) phenolic hydroxyl group, and said polymer compound is selected from the group consisting of pyrogallol-acetone resins, and phenol-formaldehyde resins, m-cresol-formaldehyde resins, p-cresol-formaldehyde resins, m-/p-mixed-cresol-formaldehyde resins and phenol/cresol (may be m-, p-, or m-/p-mixed type) mixed formaldehyde resins.

15. The composition according to claim 13, wherein said aqueous alkaline solution-soluble polymer compound has the (a-1) phenolic hydroxyl group in a side chain.

16. The composition according to claim 15, wherein said polymer compound is obtained by homopolymerization of a polymerizable monomer having the phenolic hydroxyl group wherein the monomer is selected from the group consisting of acrylamide, methacrylamide, acrylate, methacrylate, and hydroxystyrene.

17. The composition according to claim 15, wherein said polymer compound is obtained by homopolymerization of a polymerizable monomer having the phenolic hydroxyl group wherein the monomer is selected from the group consisting of N-(2-hydroxyphenyl)acrylamide, N-(3-hydroxyphenyl)acrylamide, N-(4-hydroxyphenyl) acrylamide, N-(2-hydroxyphenyl)methacrylamide, N-(3-hydroxyphenyl)methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, and 2-(4-hydroxyphenyl)ethyl methacrylate.

18. The composition according to claim 13, wherein said aqueous alkaline solution-soluble polymer compound has the (a-2) sulfonamide group, and said polymer compound is obtained by homopolymerization of a polymerizable monomer having a sulfonamide group or obtained by copolymerization of the polymerizable monomer with other polymerizable monomer(s).

19. The composition according to claim 18, wherein said polymerizable monomer having a sulfonamide group is composed of a compound with a low molecular weight having at least one sulfonamide group —NH—$SO_2$— wherein a molecule of the monomer has at least one hydrogen atom connected to a nitrogen atom and one or more polymerizable unsaturated bonds.

20. The composition according to claim 19, wherein said polymerizable monomer having a sulfonamide group is composed of a compound with a low molecular weight having an acryloyl, allyl or vinyloxy group, and a substituted sulfonylimino or substituted or mono-substituted aminosulfonyl group.

21. The composition according to claim 19, wherein said polymerizable monomer having a sulfonamide group is selected from compounds represented by the following general formulae (3) to (7):

(3)

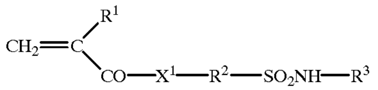

-continued (4)

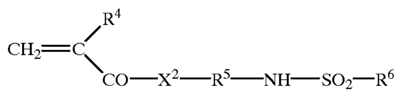

(5)

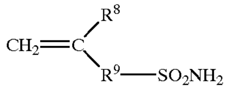

(6)

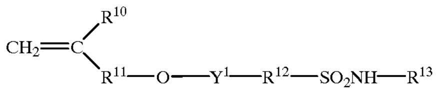

(7)

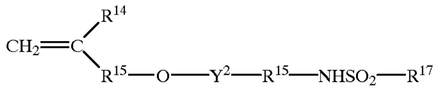

wherein $X^1$ and $X^2$ each independently represents —O— or —$NR^7$—; $R^1$ and $R^4$ each independently represents a hydrogen atom or —$CH_3$; $R^2$, $R^5$, $R^9$, $R^{12}$ and $R^{16}$ each independently represents an alkylene group, cycloalkylene group, arylene group or aralkylene group, wherein each group has 1 to 12 carbon atoms and may have a substituent; $R^3$, $R^7$ and $R^{13}$ each independently represents a hydrogen atom, alkyl group, cycloalkylene group, aryl group or aralkyl group, wherein each group has 1 to 12 carbon atoms and may have a substituent; $R^6$ and $R^{17}$ each independently represents an alkyl group, cycloalkylene group, aryl group or aralkyl group, wherein each group has 1 to 12 carbon atoms and may have a substituent; $R^8$, $R^{10}$ and $R^{14}$ each independently represents a hydrogen atom or —$CH_3$; $R^{11}$ and $R^{15}$ each independently represents a single bond, or an alkyl group, cycloalkylene group, arylene group or aralkylene group, wherein each group has 1 to 12 carbon atoms and may have a substituent; and $Y^1$ and $Y^2$ each independently represents a single bond or —CO—.

22. The composition according to claim 21, wherein said polymerizable monomer having a sulfonamide group is selected from the group consisting of m-aminosulfonylphenyl methacrylate, N-(p-aminosulfonylphenyl)methacrylamide, and N-(p-aminosulfonylphenyl)acrylamide.

23. The composition according to claim 13, wherein said aqueous alkaline solution-soluble polymer compound has the (a-3) active imide group, and said polymer compound is obtained by homopolymerization of a polymerizable monomer composed of a compound with a low molecular weight having therein at least one active imino group represented by the following formula and at least one polymerizable unsaturated bond, or obtained by copolymerization of the polymerizable monomer with other polymerizable monomer(s)

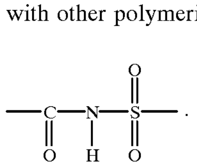

24. The composition according to claim 23, wherein said polymer compound is N-(p-toluenesulfonyl) methacrylamide or N-(p-toluenesulfonyl)acrylamide.

* * * * *